(12) United States Patent
Ishida

(10) Patent No.: US 7,188,985 B2
(45) Date of Patent: *Mar. 13, 2007

(54) VEHICULAR LAMP AND LIGHT SOURCE MODULE

(75) Inventor: Hiroyuki Ishida, Shizuoka-ken (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 145 days.

This patent is subject to a terminal disclaimer.

(21) Appl. No.: 10/892,319

(22) Filed: Jul. 16, 2004

(65) Prior Publication Data

US 2005/0018446 A1    Jan. 27, 2005

(30) Foreign Application Priority Data

Jul. 24, 2003    (JP)    ............................. 2003-279424

(51) Int. Cl.
*B60Q 1/00*    (2006.01)

(52) U.S. Cl. ...................... 362/548; 362/539; 362/545; 362/548; 362/549

(58) Field of Classification Search ................ 362/294, 362/520, 539, 545, 800, 555, 455, 548, 549
See application file for complete search history.

(56) References Cited

U.S. PATENT DOCUMENTS 5,283,802 A * 2/1994 Hsiung ..................... 372/107

5,848,839 A    12/1998 Savage, Jr.
2005/0018445 A1 *  1/2005 Sazuka et al. .............. 362/545

FOREIGN PATENT DOCUMENTS

| EP | 1 357 332 A2 | 10/2003 |
| GB | 2 401 928 A | 11/2004 |
| JP | 6-89601 A | 3/1994 |
| JP | 2003-31007 A | 1/2003 |
| JP | 2003-31011 A | 1/2003 |
| JP | 2003-123517 A | 4/2003 |

* cited by examiner

Primary Examiner—Stephen F Husar
Assistant Examiner—Meghan K. Dunwiddie
(74) Attorney, Agent, or Firm—Sughrue Mion, PLLC

(57) ABSTRACT

A vehicular lamp for use in an automobile, comprises: a light source module for generating light; an optical member operable to emit the light produced by the light source module out of said vehicular lamp; and a light source fixing member for fixing the light source module to a reference position the relative position of which with respect to the optical member is predetermined, wherein the light source module includes: a reference member which is fixed to be fitted to the reference position when the light source module is fixed to said optical member, a semiconductor light emitting element for emitting light from a lighting region having at least a linear boundary; and a holding member for fitting said linear boundary to a fixing position a relative position of which with respect to said reference position is predetermined, so as to hold said semiconductor emitting light.

13 Claims, 24 Drawing Sheets

VEHICULAR LAMP AND LIGHT SOURCE MODULE

This patent application claims priority from a Japanese patent application No. 2003-279424; filed on Jul. 24, 2003, the contents of which are incorporated herein by reference.

BACKGROUND OF THE INVENTION

1. Field of the Invention

The present invention relates to a vehicular lamp and a light source module. More particularly, the present invention relates to a vehicular lamp and a light source module for use in a vehicle such as an automobile.

2. Description of the Related Art

A vehicular lamp such as a headlight of an automobile is required to form a light distribution pattern with high accuracy for safety reasons. This light distribution pattern is formed by an optical system using a reflector or lens as disclosed, for example, in Japanese Patent Application Publication (Laid-Open) No. 6-89601. Recently it is considered to use semi conductor emitting element for a vehicular lamp.

In optical design for forming the light distribution pattern of the vehicular lamp, it is necessary to consider a shape of a light source or the like, in some cases. Moreover, a semiconductor light-emitting element generates light from a light source on its entire surface that has a predetermined width on its entire surface. Thus, in the case of using the semi conductor emitting light element for the vehicular lamp, the optical design may become complicated, resulting in difficulty in forming an appropriate light distribution pattern.

SUMMARY OF THE INVENTION

Therefore, it is an object of the present invention to provide a vehicular lamp and a light source module, which are capable of overcoming the above drawbacks accompanying the conventional art. The above and other objects can be achieved by combinations described in the independent claims. The dependent claims define further advantageous and exemplary combinations of the present invention.

According to the first aspect of the present invention, a vehicular lamp for use in an automobile, comprises: a light source module for generating light; an optical member operable to emit the light produced by the light source module out of said vehicular lamp; and a light source fixing member for fixing the light source module to a reference position a relative position of which with respect to the optical member is predetermined, wherein the light source module includes: a reference member which is fixed to be fitted to the reference position when the light source module is fixed to said optical member, a semiconductor light emitting element for emitting light from a lighting region having at least a linear boundary; and a holding member for making said linear boundary coincide with a fixing position a relative position of which with respect to said reference position is predetermined, so as to hold said semiconductor emitting light.

The optical member may project a shape of said lighting region and form at least a part of a cut line that defines a boundary between a bright region and a dark region based on a shape of said linear boundary.

The reference member may be one side of said holding member, and the light source fixing member may have a reference side to indicate said reference position and allows a plane which includes said one side to come into contact with a plane which includes said reference side so as to fit said reference member to said reference position, thereby fixing said light source module.

The semiconductor light emitting element may emit light from said lighting region that has at least two straight boundaries which are not parallel each other, and the holding member may have two sides with relative positions of which with respect to said two straight boundaries are predetermined, and the light source fixing member may have two said reference sides and allows a plane which includes two reference sides to come into contact with a plane which includes the two sides so as to fit the reference member to the reference position.

The reference member may be a hole or a projection formed in said holding member, and the light source fixing member may include a connecting member which is to be connected to said reference member corresponding to the hole or the projection at the position of the reference position.

The light source module may have at least two reference positions, and the light source fixing member may have at least two connecting members which are connected to at least each of two reference members, and one of said two connecting members may connects the reference members corresponding, including an allowance which expands in the direction connecting one connecting member to the other connecting member.

The light source module may have a first reference member corresponding to the hole or the projection and a second reference member corresponding to a side of said holding member, and the light source fixing member may have a reference side to indicate the reference position and allow a plane which includes one side to come into contact with a plane which includes the reference side so as to fit the reference member to the reference position.

According to the second aspect of the present invention, a light source module for generating light, comprising; a reference member which is fitted to a reference position that is predetermined so as to fix the light source module when the light source module is fixed to the reference position, a semiconductor light emitting element for emitting light from a lighting region having at least a linear boundary; and a holding member for fitting said linear boundary to a position with the relative position to said reference position, so as to hold said semiconductor-emitting light.

The vehicular lamp to which the present invention may be applied includes headlamps such as a regular headlamp, fog lamp or cornering lamp for automobiles, motorcycles or trains. The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
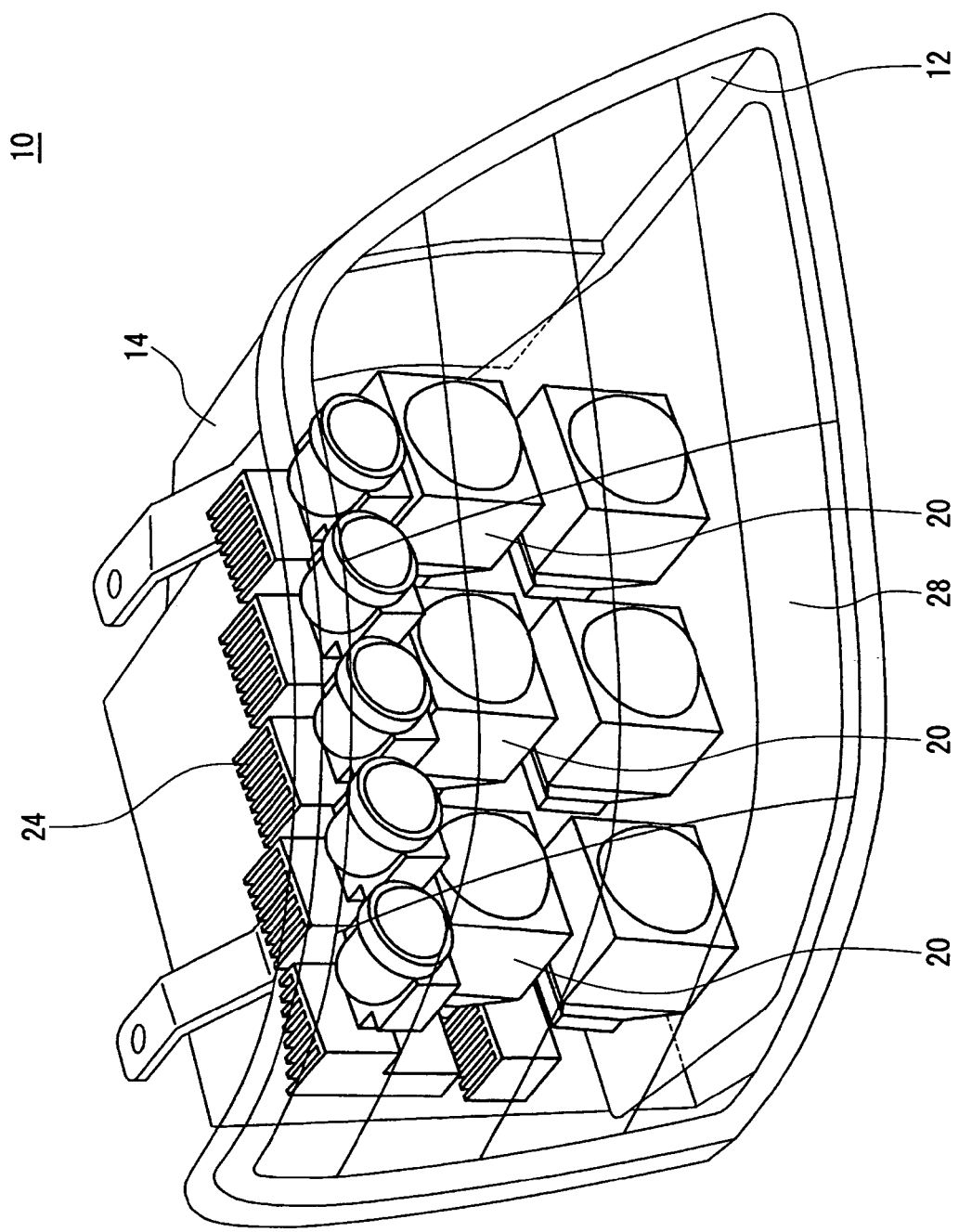
FIG. 1 is a perspective view of a vehicular lamp according to an embodiment of the present invention.
Figure 2:
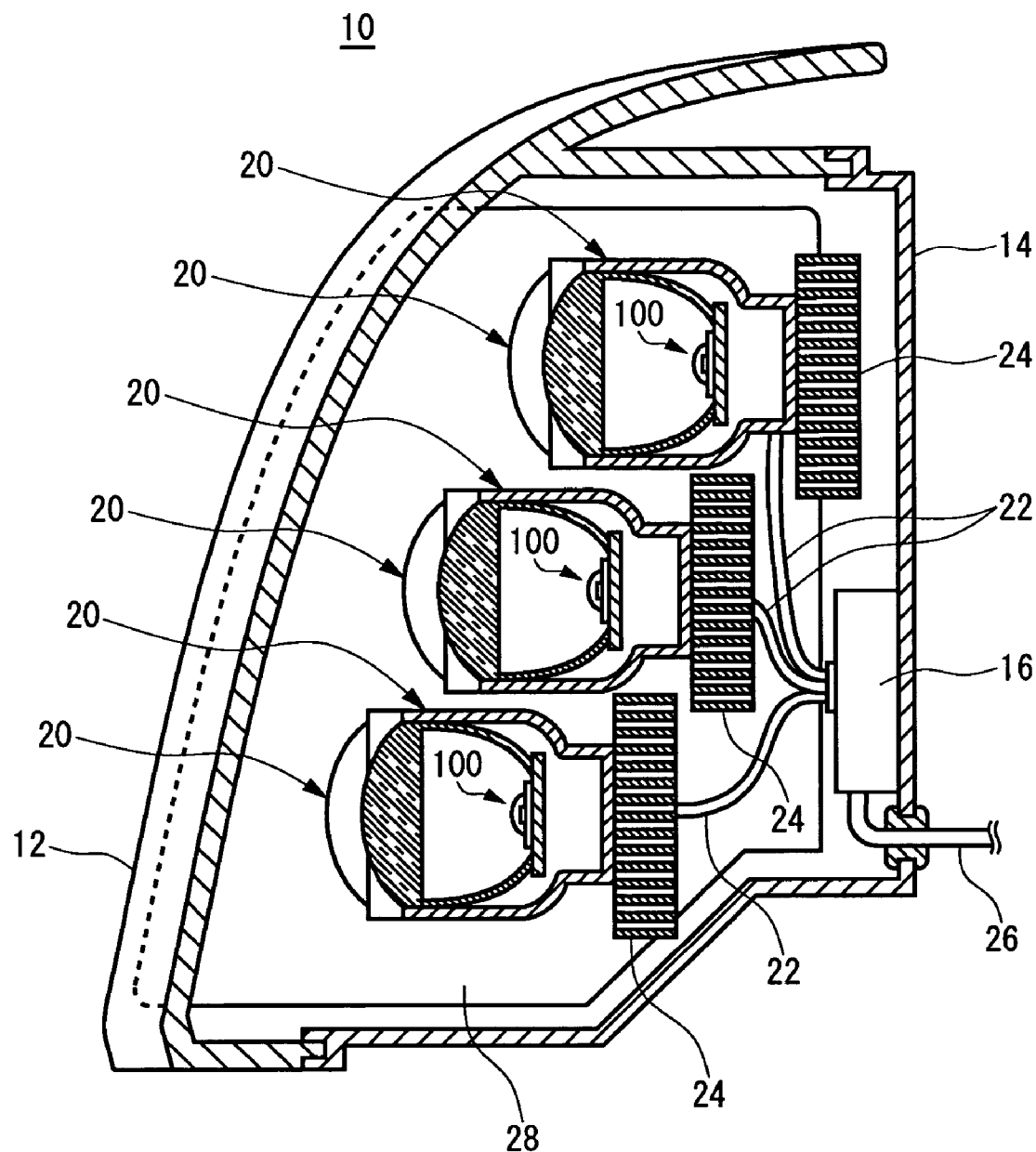
FIG. 2 is a horizontal cross-sectional view of the vehicular lamp.

FIGS. 1 and 2 show an exemplary structure of a vehicular lamp 10 according to an embodiment of the present invention. FIG. 1 is a perspective view of the vehicular lamp 10, and FIG. 2 is a cross-sectional view thereof taken along a horizontal plane crossing respective light source units 20 in the middle stage. The vehicular lamp 10 is an automotive headlight (head lamp) used in an automobile such as a vehicle, for example, and emits light forward of the automobile. The vehicular lamp 10 includes a plurality of light source units 20, a cover 12, a lamp body 14, a circuit unit 16, a plurality of heat-radiation members 24, an extension reflector 28, a cable 22 and a cable 26.

Each of the light source units 20 includes a LED module 100, and emits light having a predetermined light distribution pattern forward of the automobile in accordance with light generated by the LED module 100. The light source unit 20 is supported by a lamp body 14, for example, so as to be inclined by an aiming mechanism for adjusting a direction of an optical axis of the light source unit 20. The light source unit 20 may be supported by the lamp body 14 in such a manner that its optical axis is at a downward angle of about 0.3° to about 0.6° with the horizontal plane when the vehicular lamp 10 is mounted on the body of the automobile.

The light source units 20 may have the same or similar light distribution characteristics or different light distribution characteristics. In an alternative example, one light source unit 20 may include a plurality of light source modules 100. The light source unit 20 may include a semiconductor laser in place of the light source module 100, for example.

The cover 12 and the lamp body 14 form a lamp room of the vehicular lamp 10 and it accommodates a plurality of light source units 20. The cover 12 and the lamp body 14 may air-tightly seal the light source unit 20 and protect it from water. The cover 12 is formed to be transparent from material that can transmit light generated by the LED module 100, for example, and is provided on a front face of the automobile so as to cover the light source units 20 from the front. The lamp body 14 is provided to be opposed to the cover 12 with the light source units 20 interposed therebetween so as to cover the light source units 20 from behind. The lamp body 14 may be formed integrally with the body of the automobile.

The circuit unit 16 is a module in which a lighting circuit for lighting the LED module 100 and the like are formed therein. The circuit unit 16 is electrically connected to the light source unit 20 via the cable 22. The circuit unit 16 is also connected to the outside of the vehicular lamp 10 electrically via the cable 26.

The heat radiating members 24 are heat sinks which are provided contacting at least a part of the light source units 20. The heat-radiating member 24 is made of a material whose coefficient of thermal conductivity is higher than air such as metal. The heat radiating members 24 are pivotally movable on the aiming mechanism, accompanying the light source units 20 within a range of the movement of the light source units 20, also having a sufficient space against the lamp body 14 to adjust the light axis of the light source units 20. The heat radiating members 24 may be integrally formed as a metal member. In this case, the entire heat radiating members 24 can dissipate heat efficiently.

The extension reflector 28 is made of a thin metal plate, reaching the cover 12 from the bottoms of the light source units 20. The extension reflector 28 covers at least a part of an inner surface of the lamp body 14 so as to conceal the inner surface of the lamp body 14, thereby improving the appearance of the vehicular lamp 10.

at least a part of the extension reflector 28 touches the light source units 20 and/or the heat radiating members 24. In this case, the extension reflector 28 functions as a heat conducting member for conducting the heat produced by the LED module 100 to the cover 12. Accordingly, the extension reflector 28 dissipates the heat of the LED module 100. And a part of the extension reflector 28 is fixed to the cover 12 or the lamp body 14. The extension reflector 28 may be shaped to cover the top, bottom, and sides of the light source units 20.

According to this embodiment, using the LED module 100 as the light source, the light source units 20 can be small. In addition, thanks to this, the degree of freedom for arrangement of the light source units 20 is improved, so it is possible to provide the vehicular lamp 10 of good characteristics for design.

Figure 3:
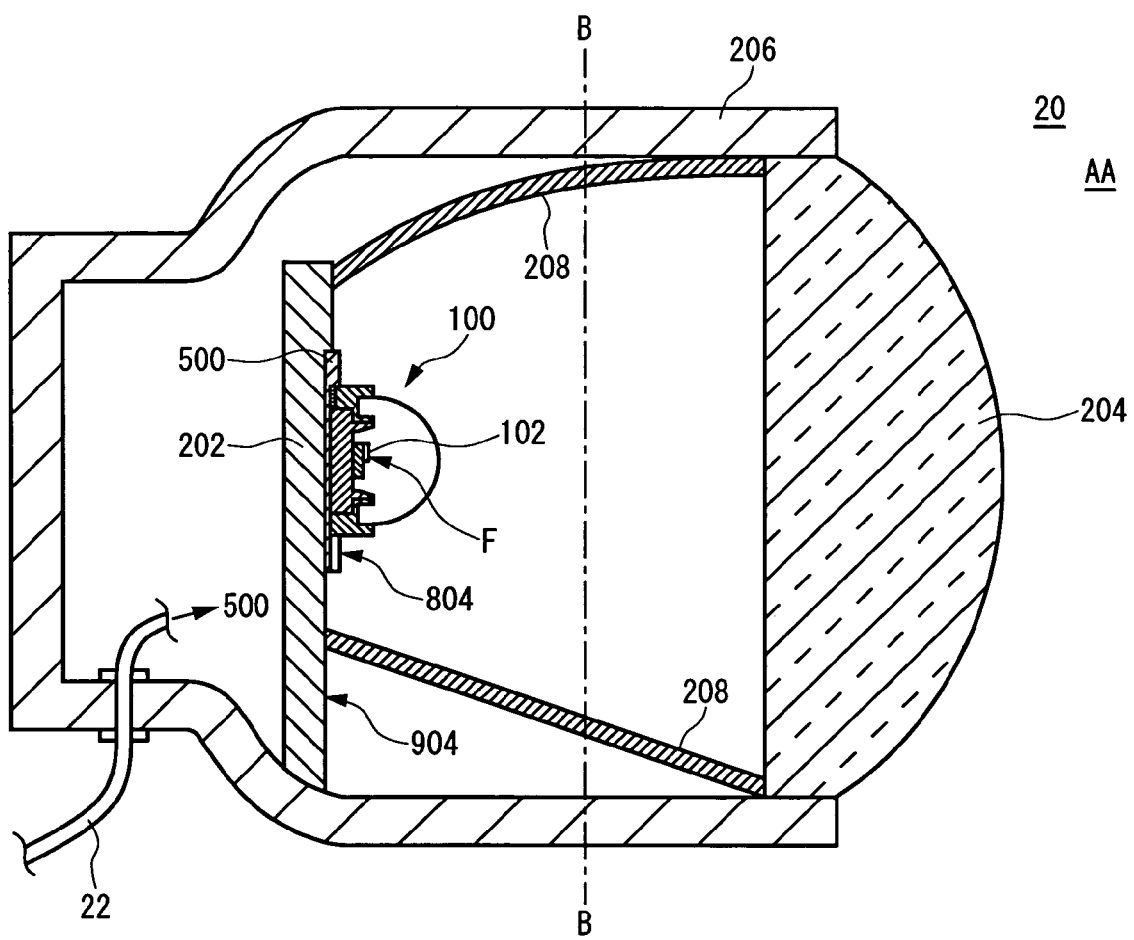
FIG. 3 is a vertically sectional view AA of a light source unit.
Figure 4:
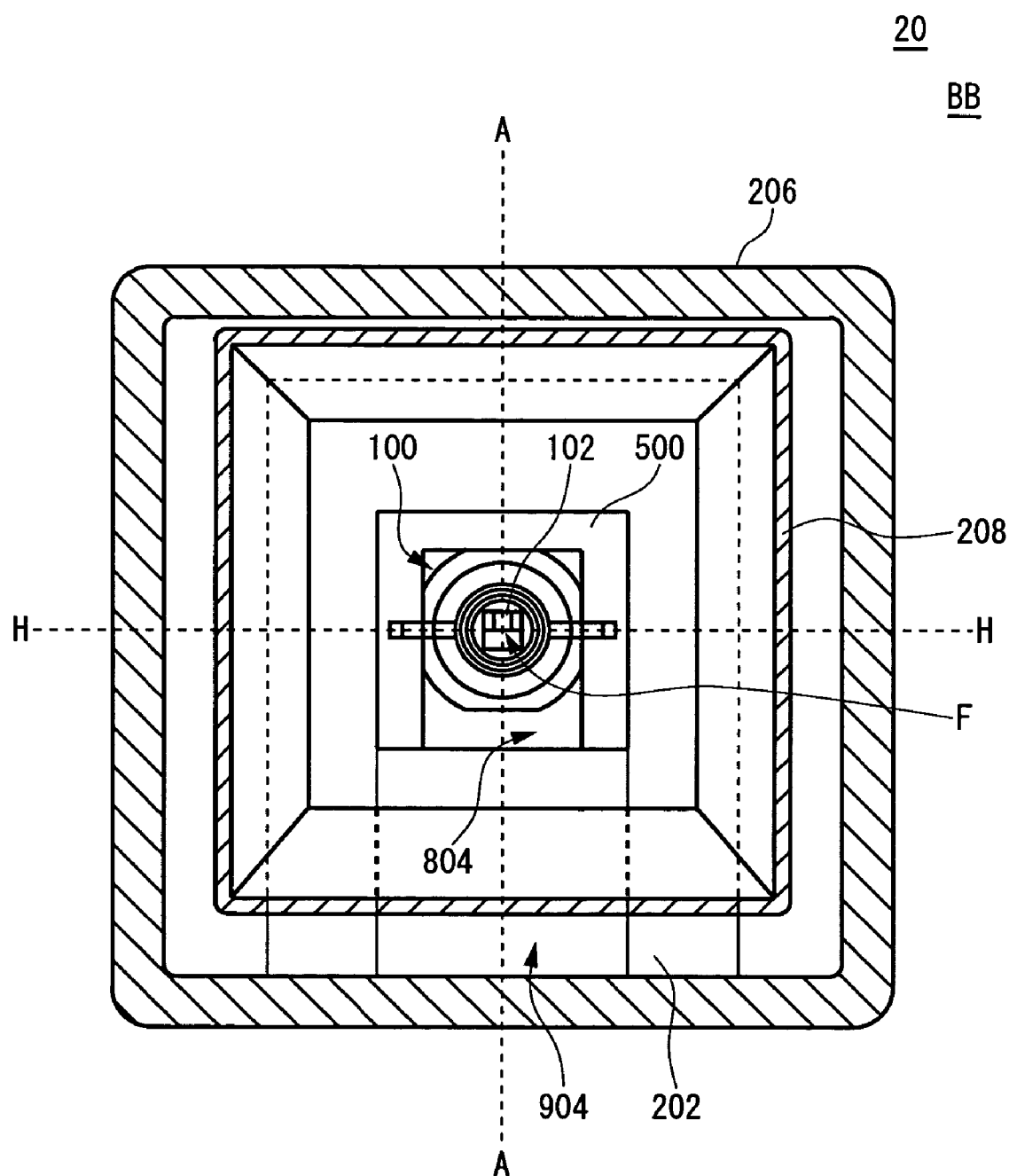
FIG. 4 is a vertically sectional view BB of the light source unit.

FIGS. 3 and 4 show an example of the configuration of the light source unit 20. FIG. 3 shows a vertically sectional view AA of a light source unit 20. FIG. 4 shows a vertically sectional view BB of the light source unit 20. The light source unit 20 is a straight emission type light source unit for emitting the light generated by the LED module 100 in the forward direction of the automobile, including a LED module 100, substrate 500, a fixing member 202, a lens 204, an extension 208, and a housing 206.

The LED module 100 is an example of light source module for generating light. LED module 100 is a light source for emitting a white light, for example, including a semiconductor light-emitting element 102. The semiconductor light-emitting element 102 generates light based on the power received from the outside of the light source unit 20 via the cable 22 and the substrate 500. In this example, the semiconductor light-emitting element 102 emits light from a lighting region which has a boundary as a straight side. Alternatively, the semiconductor light-emitting element 102 may emit light from a lighting region which has a boundary as a edge part of a light-blocking member built on the surface of the semiconductor light-emitting element 102. The semiconductor light-emitting element 102 may also emit light from a lighting region having at least a linear boundary.

The substrate 500 connects the LED module 100 and the cable 22 with a printed wiring which is formed on the surface of the substrate 500 or inside of the substrate 500, for example. In this example, substrate 500 is shaped like a plate for fixing the LED module 100 mounting the LED module, including a groove 800. The groove 800 accommodates a part of the LED module 100, thereby fixing the LED module 100 to a predetermined reference position. For example, the groove 804 allows the inner wall of the groove 804 to come into contact with a part of the outer surface of the LED module 100 so as to fix the LED module 100. Thus in this example, the substrate 500 can fix the LED module 100 with a high accuracy. The groove 804 is an example of the light source fixing member for fixing the LED module 100.

In this example, at least one of the parts of the substrate 500 is made of a material whose coefficient of thermal conductivity is higher than air such as metal. At least the part of the substrate 500 contacts the fixing member 202. Thus, the substrate 500 conducts the heat produced by the LED module 100 to the fixing member 202.

The fixing member 202 is shaped like a plate whose surface faces in the forward direction of the automobile. The fixing member 202 is provided at the fixing position the relative position of which with respect to the lens 204 is predetermined. The fixing member 202 fixes the substrate 500 on its surface, interposed between the fixing member 202 and the LED module 100. Thus, the fixing member fixes the LED module 100 in the forward direction of the automobile and makes the LED module 100 emit light in the forward direction of the automobile.

The fixing member 202 includes a groove 904. The groove 904 accommodates a part of the substrate 500 so as to fix the substrate 500 to a predetermined reference position. For example, the groove 904 allows the inner wall of the groove 904 to come into contact with the part of the substrate 500 so as to fix the substrate 500. Thus in this example, the fixing member 202 can fix the substrate 500 with a high accuracy.

And the fixing member 202 is made of a material whose coefficient of thermal conductivity is higher than air such as metal, functioning as a radiating plate for dissipating the heat produced by the LED module 100. In this example, the fixing member 202 is touching the housing 206 at its one end, so that it conducts the heat produced by the LED module 100 to the housing 206, thereby dissipating the heat of the LED module 100. Accordingly, it is possible to prevent the amount of the light emitted by the LED module 100 from being reduced by the heat.

The extension 208 is made of a thin metal plate, extending from the vicinity of the LED module 100 to the vicinity of an edge section of the lens 204. Accordingly, the extension 208 conceals the gap between an inner surface of the housing 206 and the LED module 100 so as to improve the appearance of the vehicular lamp 10 (see FIG. 1). The extension 208 may reflect the light produced by the LED module 100.

The housing 206 is shaped like a box for containing the LED module 100, the substrate 500, the fixing member 202, and the extension 208. And the housing 206 has an opening in its front face, in which the lens 204 is held. The housing 206 may conduct the heat received from the LED module 100 via the substrate 500 and the fixing member 202 to the heat radiating members 24 and/or the extension reflector 28 as shown in FIG. 1. Accordingly, it is possible to properly dissipate the heat of the LED module 100.

The lens 204 is an exemplary optical member used in the vehicular lamp 10 (see FIG. 1). The lens 204 forms at least a part of a light distribution pattern by projecting the shape of the lighting region of the semiconductor light-emitting element 102 in the forward direction of the vehicle. In this example, the lens 204 has a focus F on a side of the semiconductor light-emitting element 102, corresponding to the linear boundary at the lighting region. In this case, lens 204, for example, forms at least the part of a cut line that defines the boundary between the bright region and the dark region in the light distribution pattern, based on the shape of the linear boundary. The lens 204 may emit light generated by the LED module 100 to the outside of the vehicular lamp 10 as shown in FIG. 1.

In this example, the fixing member 202 fixes the substrate 500 with a high accuracy. Accordingly the substrate 500 fixes the LED module 100 to the reference position the relative position of which with respect to the lens 204 is predetermined. Thus, according to this example, it is possible to fix the LED module 100 to the lens 204 with high accuracy.

In this case, it is possible to fit a side of the semiconductor light-emitting element 102 to the focus F of the lens 204 with high accuracy. And thus, the lens 204 can form the cut line clearly. Thus, in this example, it is possible to form the light distribution pattern properly with high accuracy. Moreover, the focus F is an example of an optical center used for the light source units 20. The optical center is an example of a reference point in optical member design. In an alternative example, the substrate 500 and the fixing member 202 may be made of a material and combined as one structure.

Figure 5:
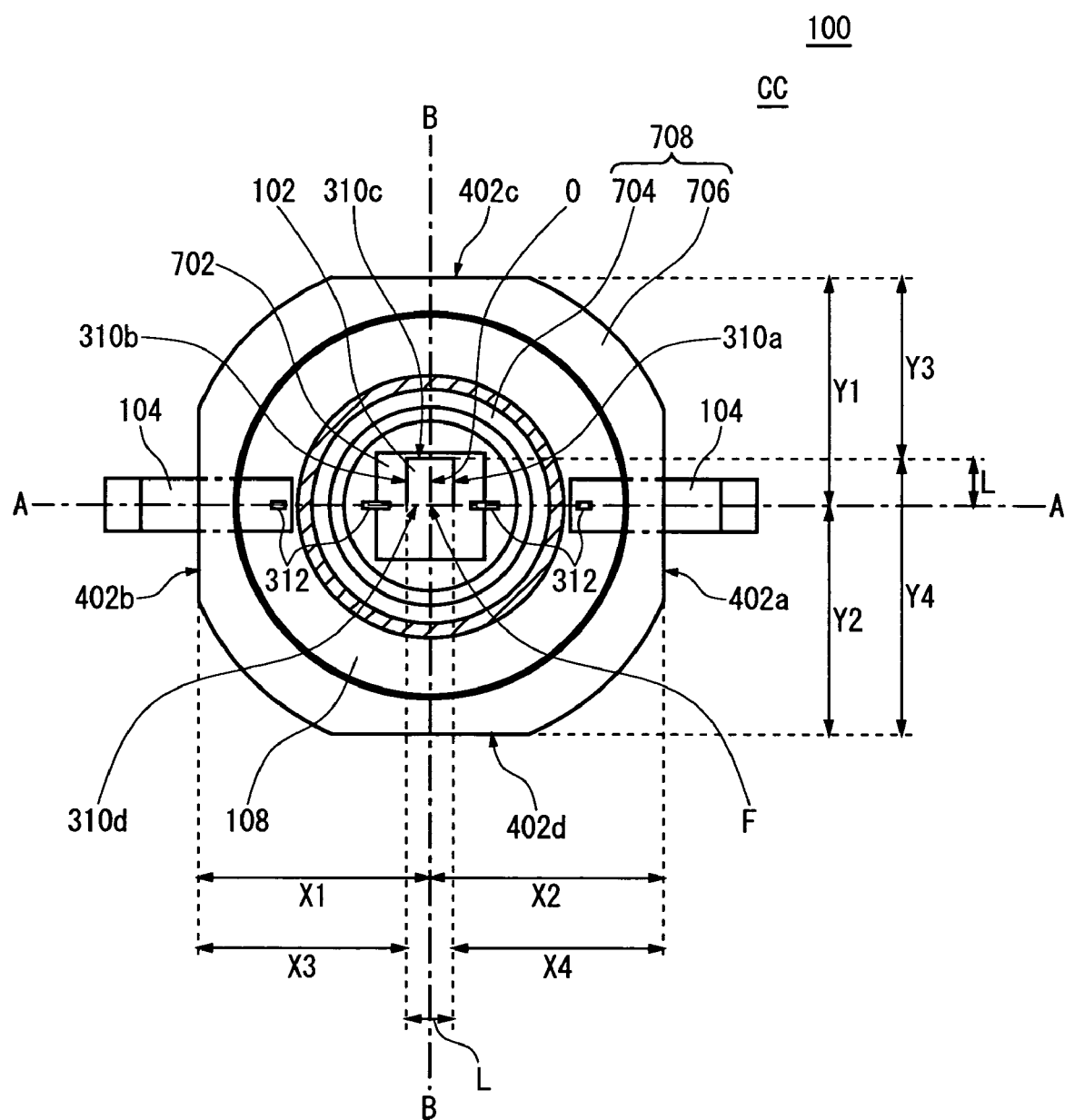
FIG. 5 is a C—C cross-section of the LED module 100.
Figure 6:
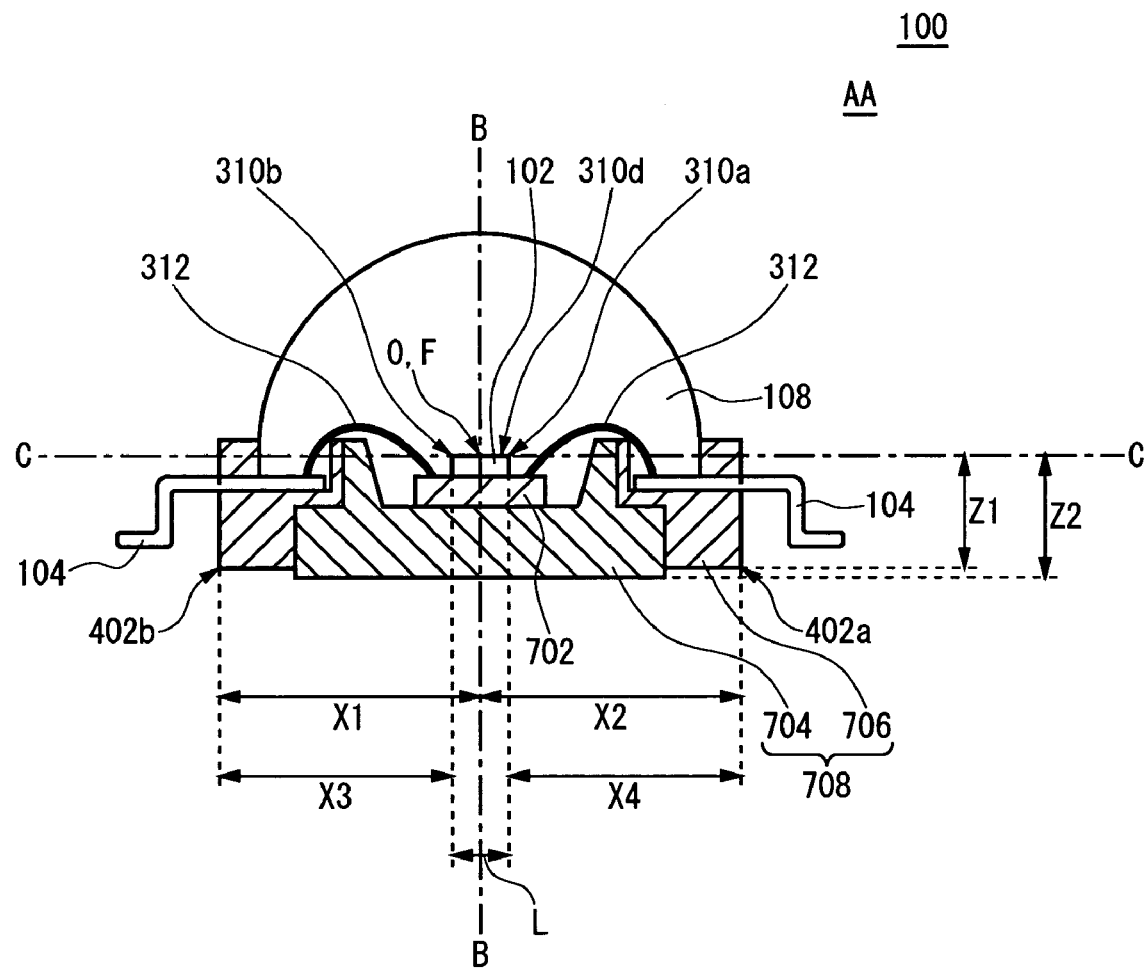
FIG. 6 is an A—A cross-section of the LED module.
Figure 7:
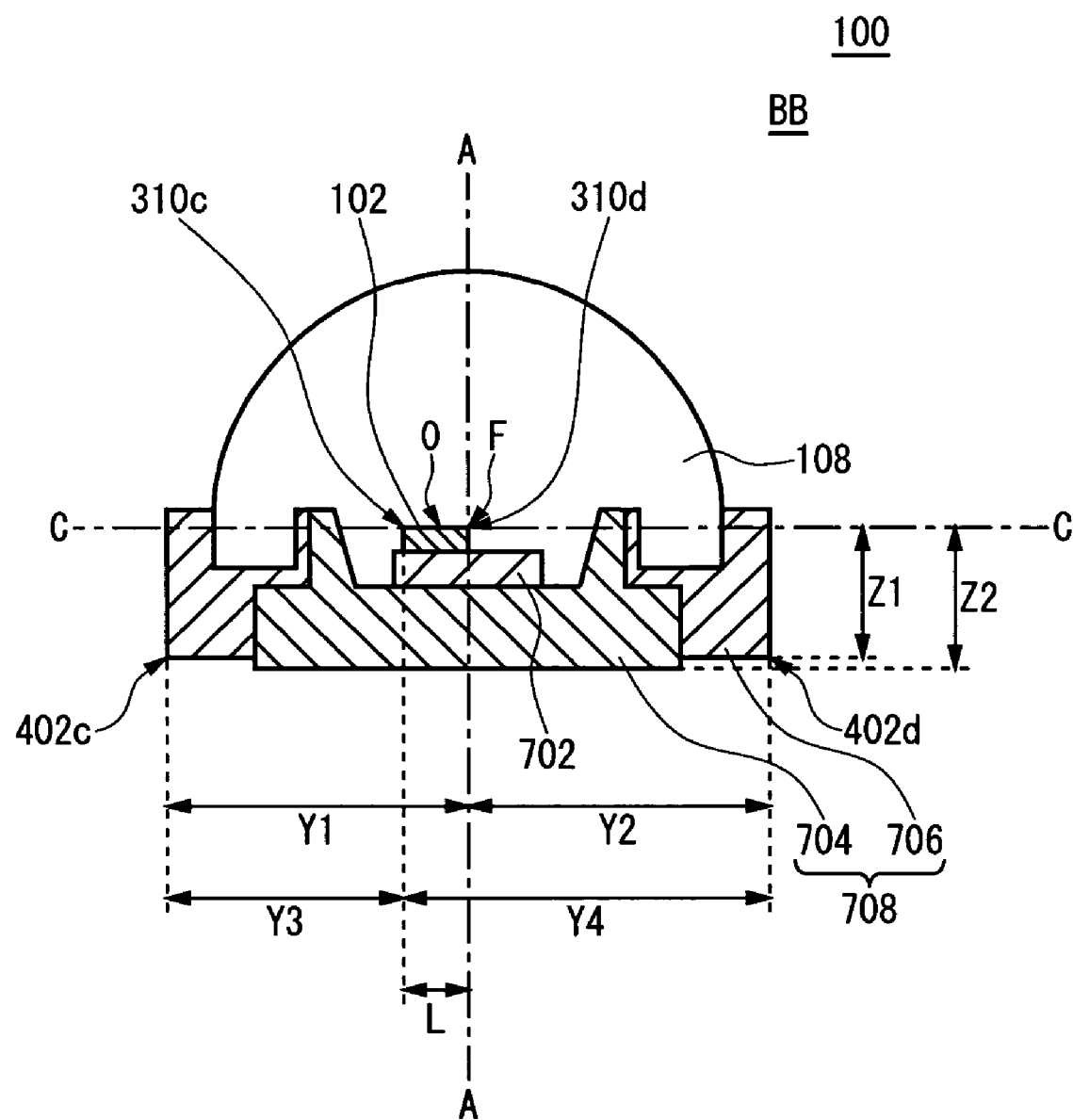
FIG. 7 is a B—B cross-section of the LED module.

FIGS. 5, 6 and 7 show a structure of the LED module 100. FIG. 5 shows a C—C cross-section of the LED module 100. FIG. 6 shows an A—A cross-section of the LED module 100. FIG. 7 shows a B—B cross-section of the LED module 100. LED module 100 includes the semiconductor light-emitting element 102, a sealing member 108, a plurality of electrodes 104, a sub mount 702, bonding wire 312, and a holding member 708.

The semiconductor light-emitting element 102 is a light emitting diode element. The semiconductor light-emitting element 102 emits blue light towards a fluorescent material provided on its surface, thereby allowing the fluorescent material to emit yellow light which is complementary to the blue light. In this case, the LED module 100 produces white light based on the blue and yellow light produced by the semiconductor light-emitting element 102 and the fluorescent material respectively. In another example, the semiconductor light-emitting element 102 may emit infrared light to the fluorescent material so as to allow the fluorescent material to emit the white light.

In this example, the semiconductor light-emitting element 102 emits light from the surface which is provided in the direction of the lens 204. The semiconductor light-emitting element 102 produces light, for example, from its entire surface as the lighting region. The semiconductor light-emitting element 102 is an example of a flat light source for producing light from a flat area with expansion.

In this example, the lighting region of the semiconductor light-emitting element 102 is an approximate square area surrounded by four straight sides 310a–d. The distance L of each side 310 may be about 1 mm, for example. This lighting region emits light regarding four straight sides 310a–d as the boundary. The lighting region has at least two straight boundaries, which are not parallel, each other, for example side 310a and side 310d. In this example, the lens 204 has the focus F at the center of the side 310d and forms at least a part of the cut line in the light distribution pattern of the vehicular lamp 10 (see FIG. 1), based on the shape of the side 310d. Further, the semiconductor light-emitting element 102 may also emit light from an end surface which continues to the surface of the semiconductor light-emitting element 102 and is imposed among the sides 310a–d, for example.

The sealing member 108 is a mold for sealing the semiconductor light-emitting element 102 and the sealing member 108 is made of a material through which the white light produced by the semiconductor light-emitting element 102 passes such as translucent resin. In this example, at least a part of the sealing member 108 is hemispherical. In this case, LED module 100 has an optical axis which runs through the center of this hemispheroid and is also vertical to the surface of the semiconductor light-emitting element 102.

The electrodes 104 are electrically connected to the substrate 500 (see FIG. 3) and supply a power supplied from the outside of the light source 20 via the substrate 500 and the cable 22 (see FIG. 3), to the semiconductor light-emitting element 102 via the bonding wire 312 and the sub mount 702. The bonding wires 312 connect the electrodes 104 and sub mount 702 electrically.

The sub mount 702 is a plate like member made of silicon, for example, and fixes the semiconductor light-emitting element 102 mounting on the surface. The sub mount 702 has a wiring that electrically connects the bonding wire 312 and the semiconductor light-emitting element 102 and supplies a power received from the outside of the LED module 100 via the bonding wire 312, to the semiconductor light-emitting element 102.

The holding member 708 has a slag 704 and a body 706. The slag 704 fixes the sub mount 702 by mounting on the surface, thereby fixing the semiconductor light-emitting element 102 to the predetermined position. In this example, the slag 704 fixes the semiconductor light-emitting element 102 in such a manner that the center of the side 310a of the semiconductor light-emitting element 102 fits the optical axis of the LED module 100 and the side 310a extends in the predetermined direction. At least one of the part of the slag 704 is made of a material whose coefficient of thermal conductivity is higher than air such as metal and conducts the heat produced by the LED module 100 to the outside of the LED module 100.

The body 706 is made of a resin or like to cover the circumference of the slag 704. The body 706 accommodates each part of the electrodes 104, thereby fixing the electrodes 104.

In this example, the body 706 has a plurality of sides 402a–402d. Each of the sides 402a–402d is an example of the reference member which indicates the position of the semiconductor light-emitting element 102. At least a part of the sides 402a–402d may be one of the sides of the holding member 708. At least a part of the sides 402a–402d is fixed by fitting the reference point of the substrate 500 when the LED module 100 is fixed to the substrate 500.

And the body 706 is provided to be fixed to the slag 704. Accordingly the holding member 708 fits the side 310 that is a linear boundary in the lighting region of the semiconductor light-emitting element 102 so as to hold the semiconductor light-emitting element 102 to the fixing position the relative position of which with respect to the side 402a to 402d is predetermined. In this case, the sides 402a to 402d are such sides the relative positions of which with respect to the side 310d are predetermined. The holding member 708 may have at least two no-parallel sides with the predetermined relative positions to the two straight boundaries in the lighting region.

In this example, it is possible to fix the side 310d of the semiconductor light-emitting element 102 to the reference position with high accuracy by fixing the LED module 100 regarding at least a part of the side 402a–402d as the reference position. As is explained using the FIGS. 3 and 4, in this example, the LED module 100 is accurately fixed to the reference position the relative position of which with respect to the lens 204 is predetermined. Thus, in this example, it is possible to align and fix the side 310d of the semiconductor light-emitting element 102 to the lens 204 with high accuracy. Thus the vehicular lamp 10 forms the cut line with high accuracy based on the shape of the side 310d. Thus, in this example, it is possible to form the light distribution pattern properly. In alternative example, the holding member may fit any of the sides 310a to 310d to the fixing position the relative position of which with respect to the sides 402a to 402d is predetermined so as to hold the semiconductor light-emitting element 102. In this case, it is also possible to form the cut line with high accuracy based on some of shapes of the sides 310a to 310c.

Next, the measurement of the LED module 100 is described in further detail. In this example, the holding member 708 fixes the semiconductor light-emitting element 102 on the sub mount 702 with reference to the position of the side 310d. The semiconductor light-emitting element 102 is provided on the slag 704 and sub mount 702, using an image processing technology which detects the relative position to the slag 704. Thus, it is possible to align and fix the side 310a of the semiconductor light-emitting element 102.

The holding member 708 fixes the semiconductor light-emitting element 102 in such a manner that the distance between the side 310d and the side 402d is equal to the distance Y2. In this example, the distance between the side 310d and the side 402d is, for example, defined as the distance between each projected images when the side 310d and the side 402d are projected on the plane parallel to the surface of the semiconductor light-emitting element 102.

It is preferred that the holding member 708 fits the distance between the side 402d and side 310d so as to fix the side 310d with the accuracy of which the position error is less than the distance corresponding to 5 percent of the distance L defined as the distance of one side of the semiconductor light-emitting element 102. In this case, it is possible to form the cut line properly. It is further preferred that the holding member 708 fixes the side 310d with the accuracy of which the position error is less than the distance corresponding to 1 percent of the distance L. In this case, it is possible to form the cut line more properly. For example, the holding member may fix the side 310a with the accuracy of the position error whose value is less than 0.01 mm.

In another example, the holding member 708 may fix the semiconductor light-emitting element 102 in such a manner that the distance between the side 310d and the side 402c is equal to the distance Y1. Further, the holding member 708 may fix the semiconductor light-emitting element 102 in such a manner that the distance between the side 310*c* and the side 402*d* is equal to the distance Y4 or the distance between the side 310*c* and the side 402*c* is equal to the distance Y3. Further, the side 310*c* is an opposite side of the side 310*d* which is on the surface of the semiconductor light-emitting element 102. The side 402*c* is opposed to the side 402*d*, with the semiconductor light-emitting element 102 interposed therebetween.

Further the holding member fixes the semiconductor light-emitting element 102 in such a manner that the distance between the end of the side 310*d* and the side 402*b* is equal to the predetermined distance X3. The distance between the one end of the side 310*d* and the side 402*b* is defined as the distance between the side 402*b* and the side 310*b* which intersects with the side 310*d* at that end. In another example, the holding member 708 may fix the semiconductor light-emitting element 102 in such a manner that the distance between the other end of the side 310*d* and the side 402*a* is equal to the predetermined distance X4.

The holding member 708 may fix the semiconductor light-emitting element 102 in such a manner that the distance between the center of the side 310*d* and the side 402*b* is equal to the predetermined distance X1 or the distance between the center of the side 310*d* and the side 402*a* is equal to the predetermined distance X2. The distance between the center of the side 310*d* and the side 402*b* is defined as the distance between projected images when the center of the side 310*d* and the side 402*a* are projected on the plane parallel to the surface of the semiconductor light-emitting element 102, and the distance between the center of the side 310*d* and the side 402*a* is defined as the distance between projected images when the center of the side 310*d* and the side 402*b* are projected on the plane parallel to the surface of the semiconductor light-emitting element 102, for example.

The holding member 708 fixes the semiconductor light-emitting element 102 in such a manner that the distance between the surface of the semiconductor light-emitting element 102 and a bottom surface of the body 706 is equal to the predetermined distance Z1. For example, the bottom surface of the body 706 is defined as the plane which includes at least a part of the sides 412*a*–*d* and is parallel to the surface of the semiconductor light-emitting element 102. In another example, the holding member 708 may fix the semiconductor light-emitting element 102 in such a manner that the distance between the surface of the semiconductor light-emitting element 102 and bottom surface of the slag 704 is equal to the predetermined distance Z2. In this example, it is possible to fix the semiconductor light-emitting element 102 with a high accuracy.

Figure 8:
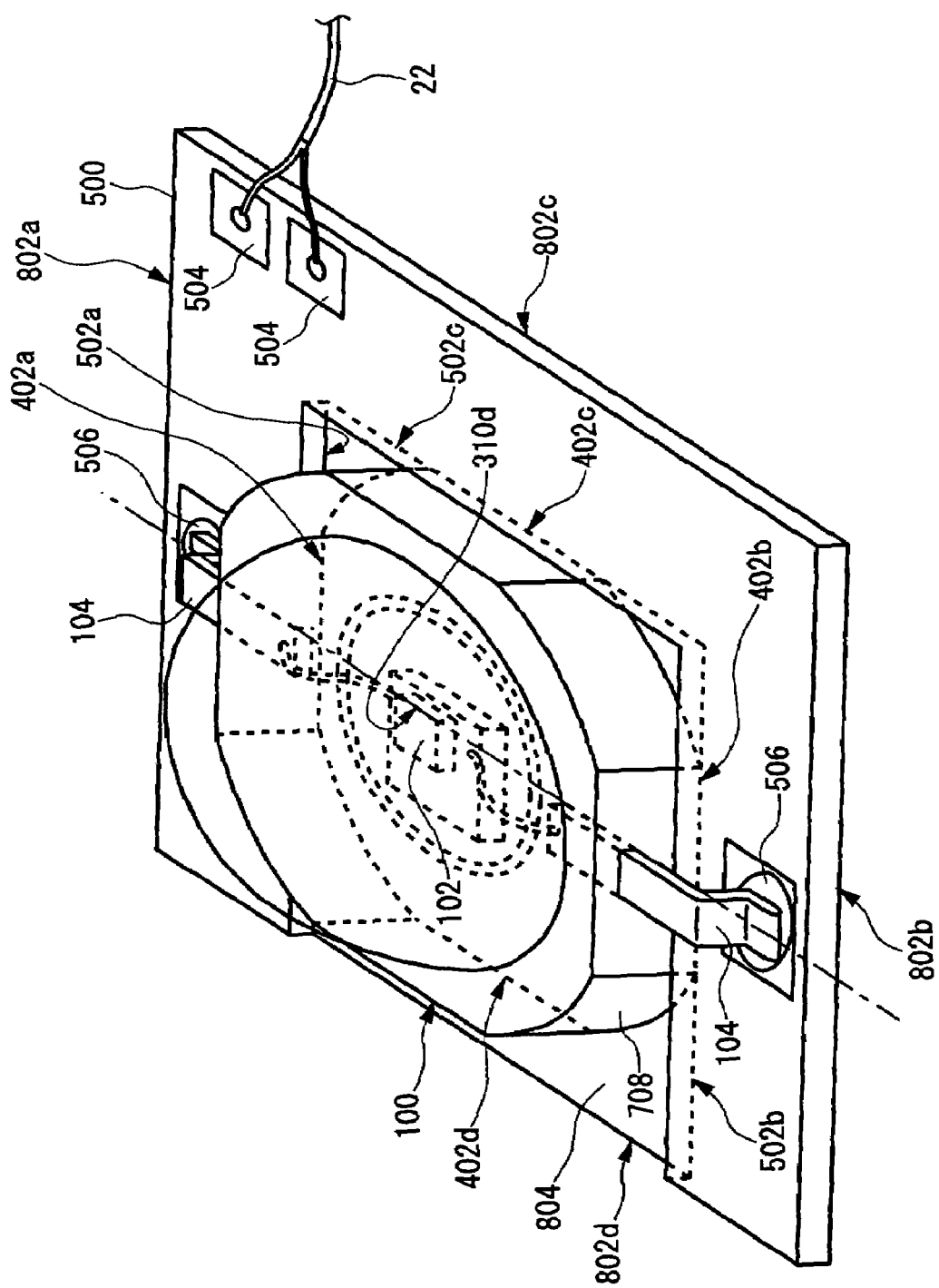
FIG. 8 shows an exemplary structure of the substrate.

FIG. 8 shows an exemplary structure of the substrate 500 with the LED module 100. In this example, the substrate 500 includes a plurality of pads 504, a plurality of pads 506, and groove 804.

The pads 506 are connected to the electrodes 104 of the LED module 100 by soldering for example. The pads 504 are connected to the cable 22 by soldering and also connected electrically to the pads 506 via a printed wiring formed on the surface or the inside of the substrate 500. Thus the substrate 500 connects the cable 22 and the LED module 100 electrically.

The groove 804 accommodates a part of the holding member 708, thereby fixing the LED module 100. In this example, the groove 804 includes a plurality of sides 502*a*–502*c*. Each of the sides 502*a*–502*c* is an example of a reference side which indicates the reference position where the LED module 100 is to be fitted. The groove 804 allows the outside face of the holding member 708 including the side 402*a*–402*c* to come into contact with the faces of the inside walls including the side 502*a*–502*c*, thereby fixing the LED module 100 to the reference position. The substrate 500 may fix the LED module 100 by fitting the sides 402*a*–402*c* to the reference position. In this example, it is possible to fix the LED module 100 with high accuracy. Thus, it is possible to fix the semiconductor light-emitting element 102 with high accuracy.

The substrate 500 includes sides 802*a*–*d* in the side face of the substrate 500, and is fixed to the fixing member 202 (see FIG. 3) regarding at least a part of the sides 802*a*–*d* as a reference. For example, the fixing member 202 allows the side faces of the substrate 500 including the side 802*a*–802*c* to come into contact with the face of inside wall of the groove 904 (see FIG. 3), thereby fixing the substrate 500. In this case, the fixing member can fix the substrate 500 with high accuracy. Thus, in this example, it is possible to fix the LED module 100 with high accuracy to the reference position with the relative position to the lens 204 (see FIG. 3), for example. Accordingly, the vehicular lamp 10 (see FIG. 1) can form the light distribution pattern properly.

Figure 9:
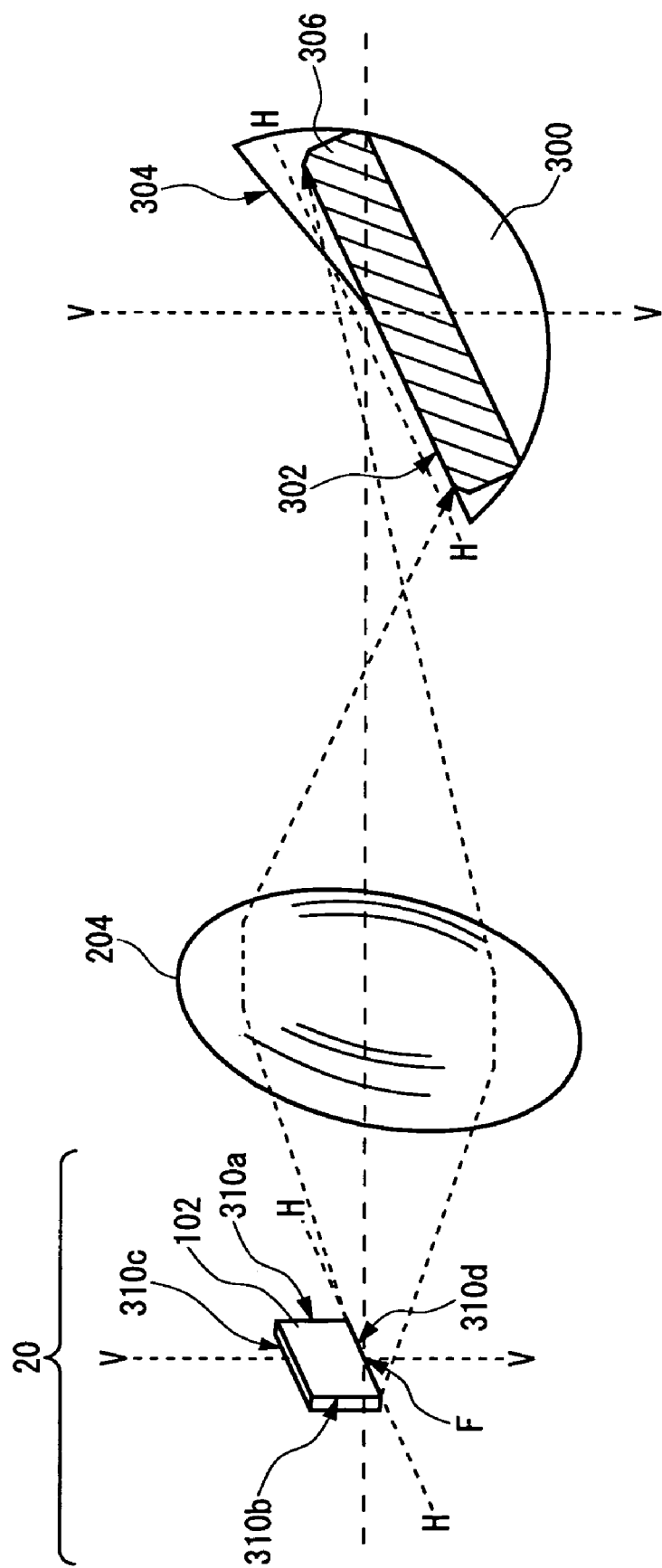
FIG. 9 shows an example of a light distribution pattern.

FIG. 9 shows an example of a light distribution pattern 300 formed by the vehicular lamp 10 (see FIG. 1). The light distribution pattern 300 is a low beam light distribution pattern which is formed on a vertically virtual screen disposed 25 m away from the front of the vehicular lamp 10. In this example, the vehicular lamp 10 forms the light distribution pattern 300 having a the horizontal cut line 302 which determines the boundary between bright and dark in an approximately horizontal direction and an oblique cut line 304 which determines the boundary between bright and dark in an oblique direction by 15 degree against the horizontal direction.

In this example, the vehicular lamp 10 includes the plurality of light source units 20 whose light distribution characteristics are different from each other, forming the light distribution pattern 300 based on the light produced by each of the light source units 20. In this case, each of the light source units 20 forms a partial area of the light distribution pattern 300. For example, the light source unit 20 described in connection with FIGS. 3 and 4 forms a partial area 306 of the light distribution pattern 300.

Hereafter, the light distribution characteristics of the light source units 20 described in connection with FIGS. 3 and 4 will be described in detail. In this example, the lens 204 of the light source units 20 emits the light produced by the semiconductor light emitting element 102 forward, projecting the shape of the lighting reign of the semiconductor light emitting element 102 in the forward direction of the vehicle so as to form an area 306. The lens 204 may magnify and project the shape of the lighting region in the horizontal direction.

Here in this example, the lens 204 has its focus F on the side 310*d* of the semiconductor light-emitting element 102. The side 310*d* is a lower side of the semiconductor light-emitting element 102, extending in the horizontal direction. And the lens 204 emits the light produced by the semiconductor light-emitting element 102 in order that the light axes of the light source units 20 cross each other. Accordingly, the lens 204 projects the shape of the side 310*d* of the semiconductor light-emitting element 102 to the position of an upper side of the area 306.

The lens 204 forms at least a part of the upper side of the area 306 at the position where at least a part of the horizontal cut line 302 is to be formed. Accordingly, the light source units 20 form at least a part of the horizontal cut line 302 based on the boundary between bright and dark formed by the area 306.

Here, the LED module 100 is fixed with high accuracy to the predetermined position by the side 402 (see FIG. 5) that has already aligned to the side 310d. Therefore, according to this embodiment, it is possible to form the clear horizontal cut line 302 based on the shape of the side 310d. And thus, it is possible to form a proper light distribution pattern. In another example, the semiconductor light-emitting element 102 may be fixed to be in such a manner that the side 310d is parallel to an oblique direction predetermined. In this case, the light source units 20 form at least a part of the oblique cut line 304.

Figure 10:
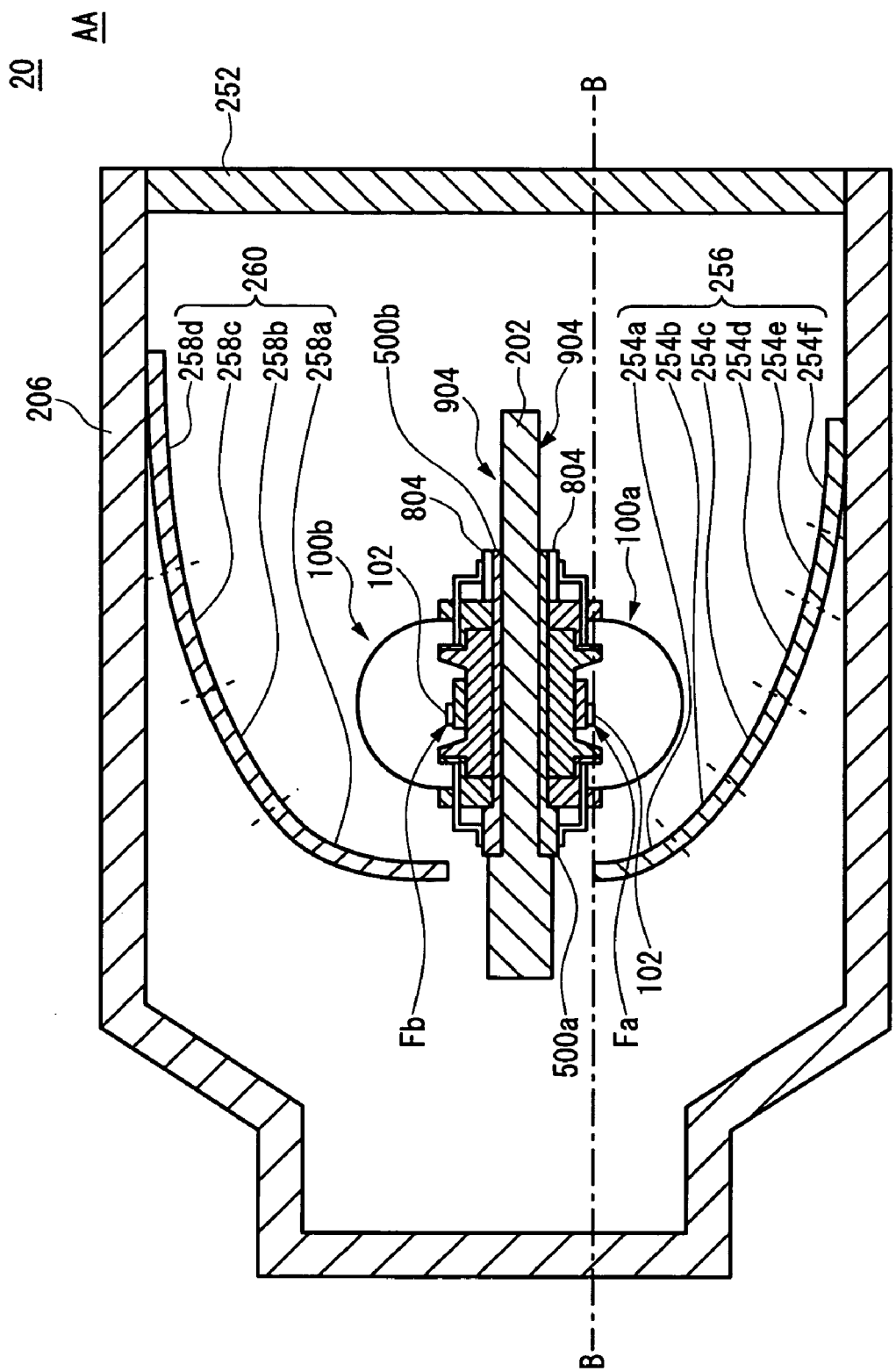
FIG. 10 shows a horizontally sectional view A—A of the light source unit.
Figure 11:
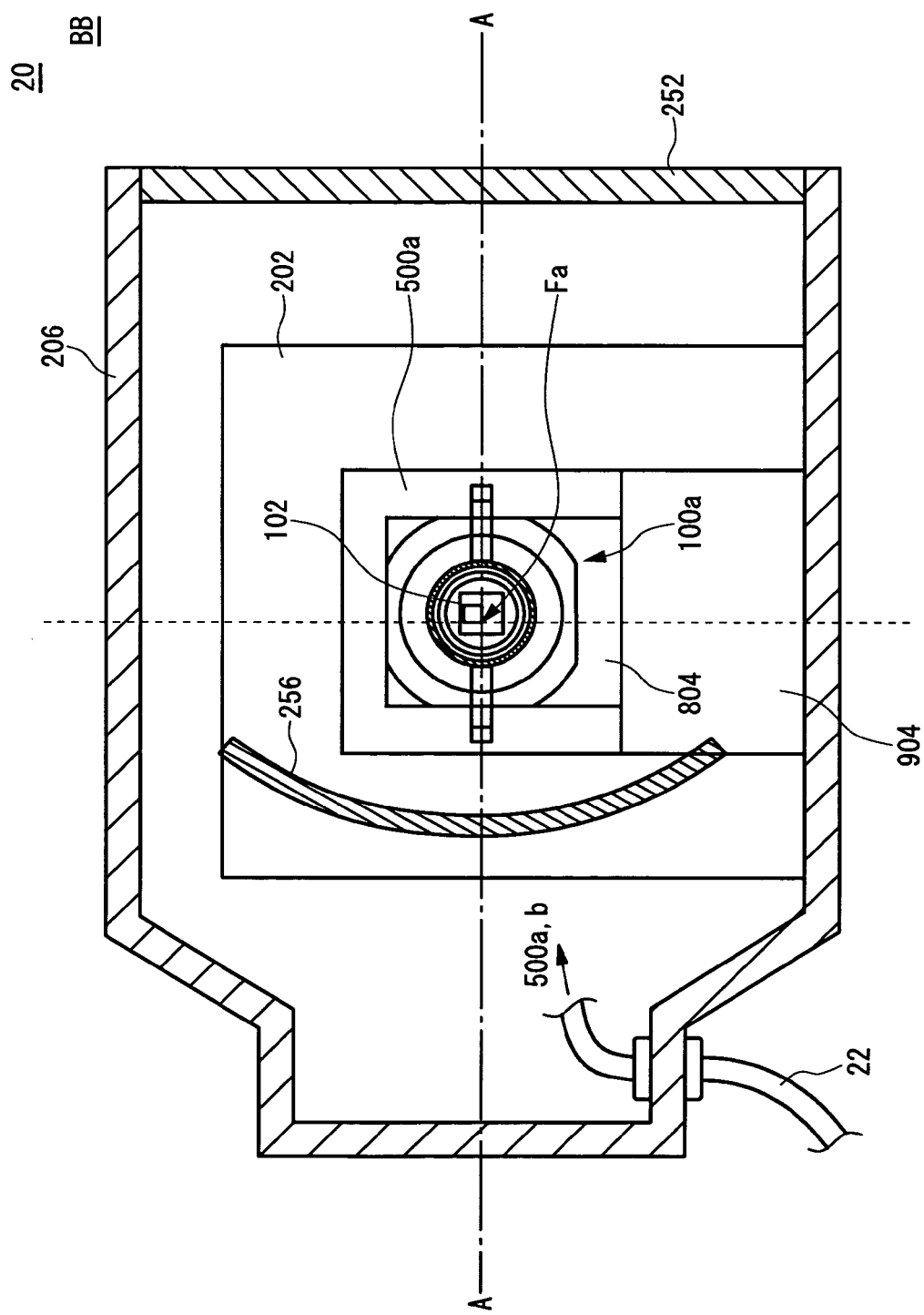
FIG. 11 shows a vertically sectional view B—B of the light source unit.

FIGS. 10 and 11 show another example of the configuration of the light source unit 20. FIG. 10 shows a horizontally sectional view AA of the light source unit 20. FIG. 11 shows a vertically sectional view BB of the light source unit 20. Further, matters in FIGS. 10 and 11 given the same symbols as those in FIGS. 3 and 4 except the points to be described later will not be described because they have the same or similar functions as those in FIGS. 3 and 4.

In this example, the light source units 20 includes a cover 252, a plurality of LED modules 100a and 100b, a plurality of substrate 500a and 500b, a fixing member 202, a plurality of reflectors 256 and 260 and a hosing 206. The cover 252 is made of a material through which the light produced by the semiconductor light emitting element 102 can pass, translucently formed on the front surfaces of the light source units 20.

The fixing member 202 is provided in such a manner that each of the front and rear surfaces of the fixing member 202 faces in the right and left direction of the automobile. And the substrate 500a and 500b are fixed to the front and rear surfaces of the fixing member 202 respectively. The fixing member 202 fixes the substrate 500a and 500b by the grooves 904 provided on the front and rear surface of the fixing member 202.

Each of the substrate 500a and 500b fixes each of a plurality of LED module 100a and 100b by the grooves 804 which are provided on the substrate 500a and 500b respectively. In this case, the substrate 500a fixes the LED module 100a to the reference position the relative position of which with respect to the reflector 256 is predetermined. And the substrate 500b fixes the LED module 100b to the reference position the relative position of which with respect to the reflector 260 is predetermined.

Here, the reference position corresponding to the LED module 100a is predetermined at a position a relative position of which with respect to the optical center Fa is predetermined, for example. The reference position is determined on a line that has a point of which relative position to the optical center Fa is known, at its end, and extends in the horizontal direction. Further, the optical center Fa is a reference point in designing the reflector 256. The substrate 500a matches the optical center Fa with an apex of the semiconductor light-emitting element 102 in the LED module 100a, so as to fix the LED module 100a. The substrate 500b matches the optical center Fb of the reflector 260 with an apex of the semiconductor light-emitting element 102 in the LED module 100b, so as to fix the LED module 100b. The fixing member 202, the substrate 500a and 500b fix the LED module 100a and 100b in such a manner that their bottom surfaces face each other with the fixing member 202 interposed therebetween.

Each of the reflectors 256 and 260 in response to the LED modules 100a and 100b respectively is formed to cover the corresponding LED module 100 from the back of the vehicle. Accordingly, each of the reflectors 256 and 260 reflects the light produced by the semiconductor light-emitting element 102 of the corresponding LED module 100 in the forward direction of the vehicle. Further, the reflectors 256 and 260 are an example of optical members used in the vehicular lamp 10 (see FIG. 1). The reflectors 256 and 260 emits the light produced by the corresponding semiconductor light emitting elements 102 in the forward direction of the vehicle so as to form at least a part of the light distribution pattern of the vehicular lamp 10.

In this example, the reflector 256 has a plurality of light distribution steps 254a to 254f. The reflector 256 forms at least a part of the oblique cut line of the light distribution pattern of the vehicular lamp 10 based on the light reflected by the light distribution steps 254a to 254f.

Here, each of the light distribution steps 254a to 254f is a part of the reflector 256 which is sectioned in the shaped of a rectangle or obliquely sloping trapezoid, formed of, e.g. a hyperbolic and parabolic surface which is set corresponding to the shape of the oblique cut line supposed to be formed at each position on a parabolic surface. Here, the hyperbolic and parabolic surface is the same as or similar to a curved surface formed of parabolas whose substantially vertical cross-section becomes wider towards the front of the light source unit 20 and whose substantially horizontal cross-section becomes wider towards the back of the light source unit 20.

The reflector 260 includes a plurality of the light distribution steps 258a to 258f. The reflector 260 forms at least a part of the horizontal cut line of the light distribution pattern of the vehicular lamp 10 based on the light reflected by the light distribution steps 258a to 258f. The light distribution steps 258a to 258f may have the same configurations as those of the light distribution steps 254a to 254f. According to this embodiment, the light distribution pattern can be properly formed.

Figure 12:
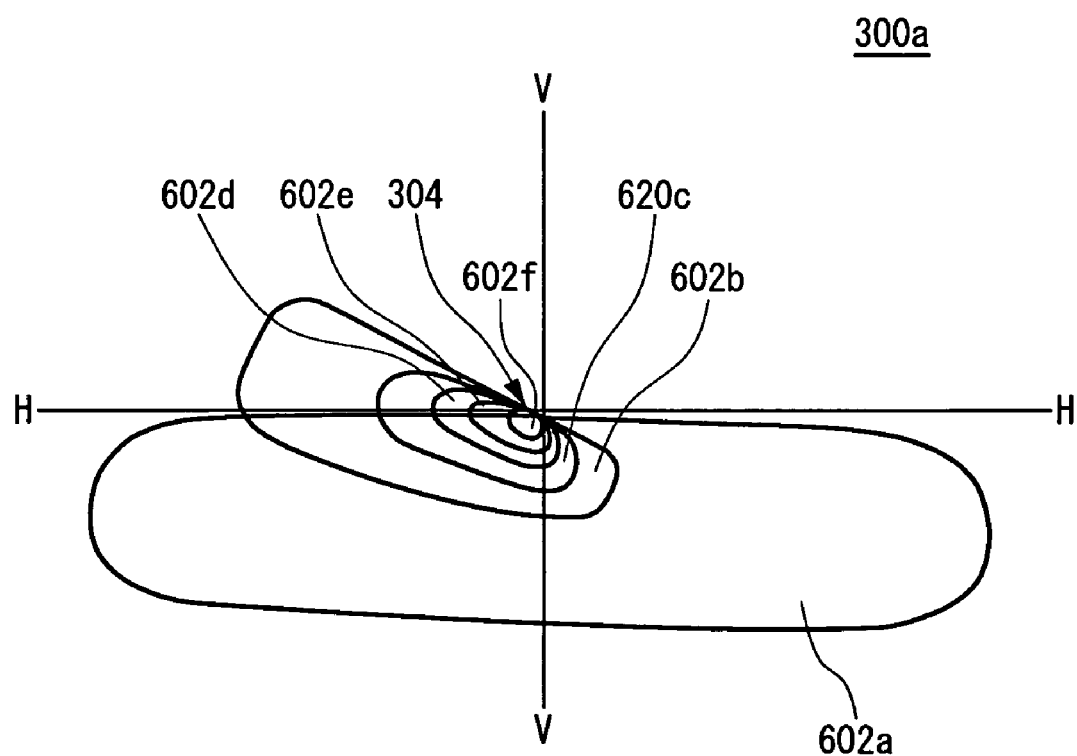
FIG. 12 shows an example of a light distribution pattern.
Figure 12:
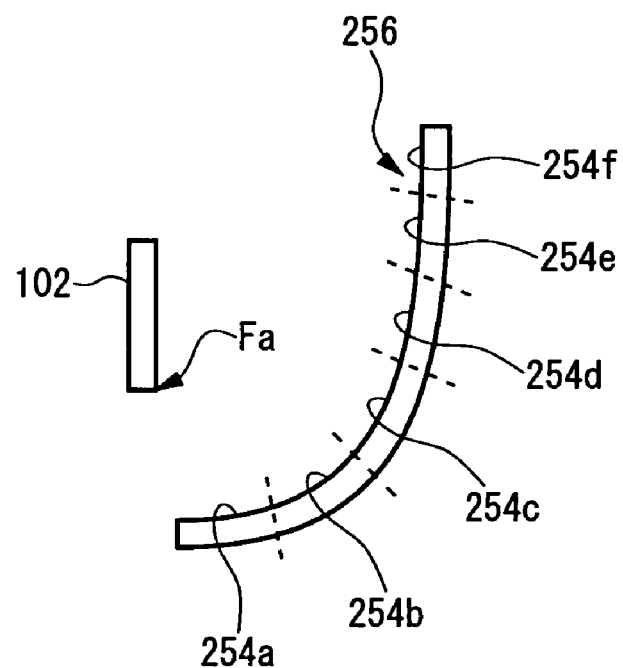

FIG. 12 shows an example of a light distribution pattern 300a formed by the reflector 256. In this example, the light distribution pattern 300a includes a plurality of areas 602a to 602f. Each of the light distribution steps 254a to 254f reflects the light produced by the semiconductor light-emitting element 102 of the LED module 100a (see FIG. 1) so as to form the areas 602a to 602f respectively.

In this case, the light distribution step 254a forms the area 602a which expands in the approximately horizontal direction. And the light distribution steps 254b to 254f form the areas 602b to 602f which expand in a predetermined oblique direction. The reflector 256 forms at least a part of the oblique cut line 304 based on the boundary between bright and dark of the areas 602b to 602f.

Here, the semiconductor light-emitting element 102 is fixed in order that at least one of its sides fits into the optical center Fa of the reflector 256. And the light distribution steps 254a to 254f are formed to take the optical center Fa as their common reference point in design. Therefore, according to this embodiment, the oblique cut line 304 can be formed with high precision based on the light produced by the LED module 100a. In addition, the light distribution pattern can be properly formed.

Figure 13:
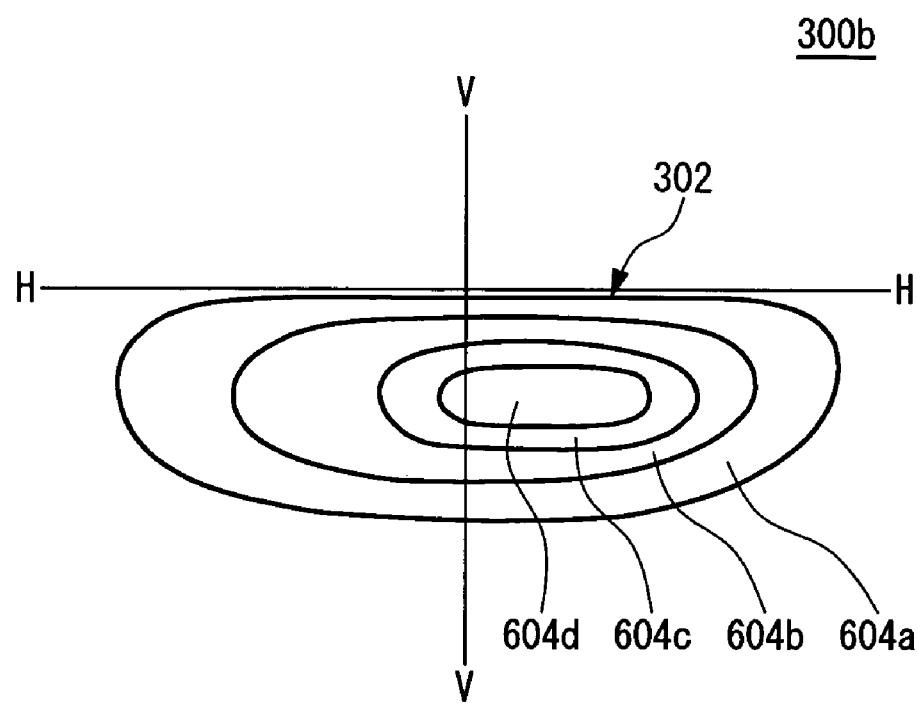
FIG. 13 shows an example of a light distribution pattern.
Figure 13:
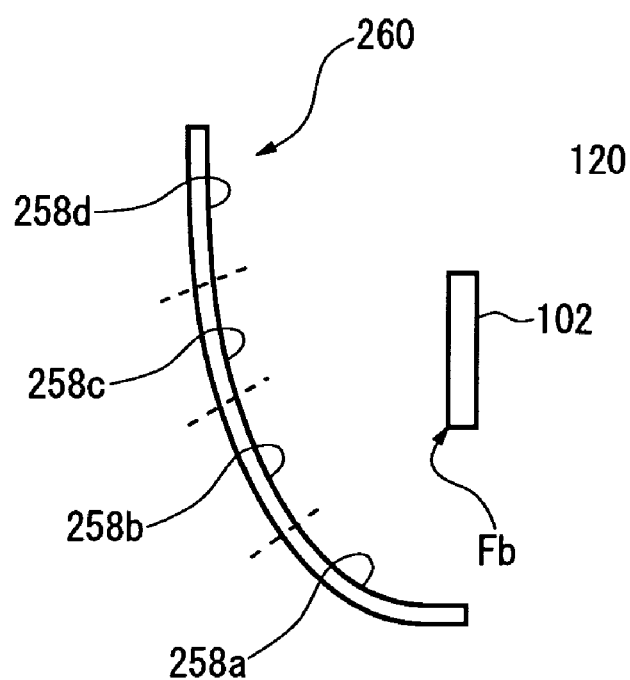

FIG. 13 shows an example of a light distribution pattern 300b formed by the reflector 260. In this example, the light distribution pattern 300b includes a plurality of areas 604a to 604d. Each of the light distribution steps 258a to 258f reflects the light produced by the semiconductor light-emitting element 102 of the LED module 100b (See FIG. 1) so as to form the areas 604a to 604d respectively. The reflector 260 forms at least a part of the horizontal cut line 302 based on the boundary between bright and dark of the areas 604a, for example.

Here, the semiconductor light-emitting element 102 is fixed in order that at least one of the sides fits into the optical center Fb of the reflector 260. And the light distribution steps 258a to 258f are formed to take the optical center Fb as their common reference point in design. Therefore, according to this embodiment, the horizontal cut line 302 can be formed with high precision based on the light produced by the LED module 100b. In addition, the light distribution pattern can be properly formed.

Figure 14:
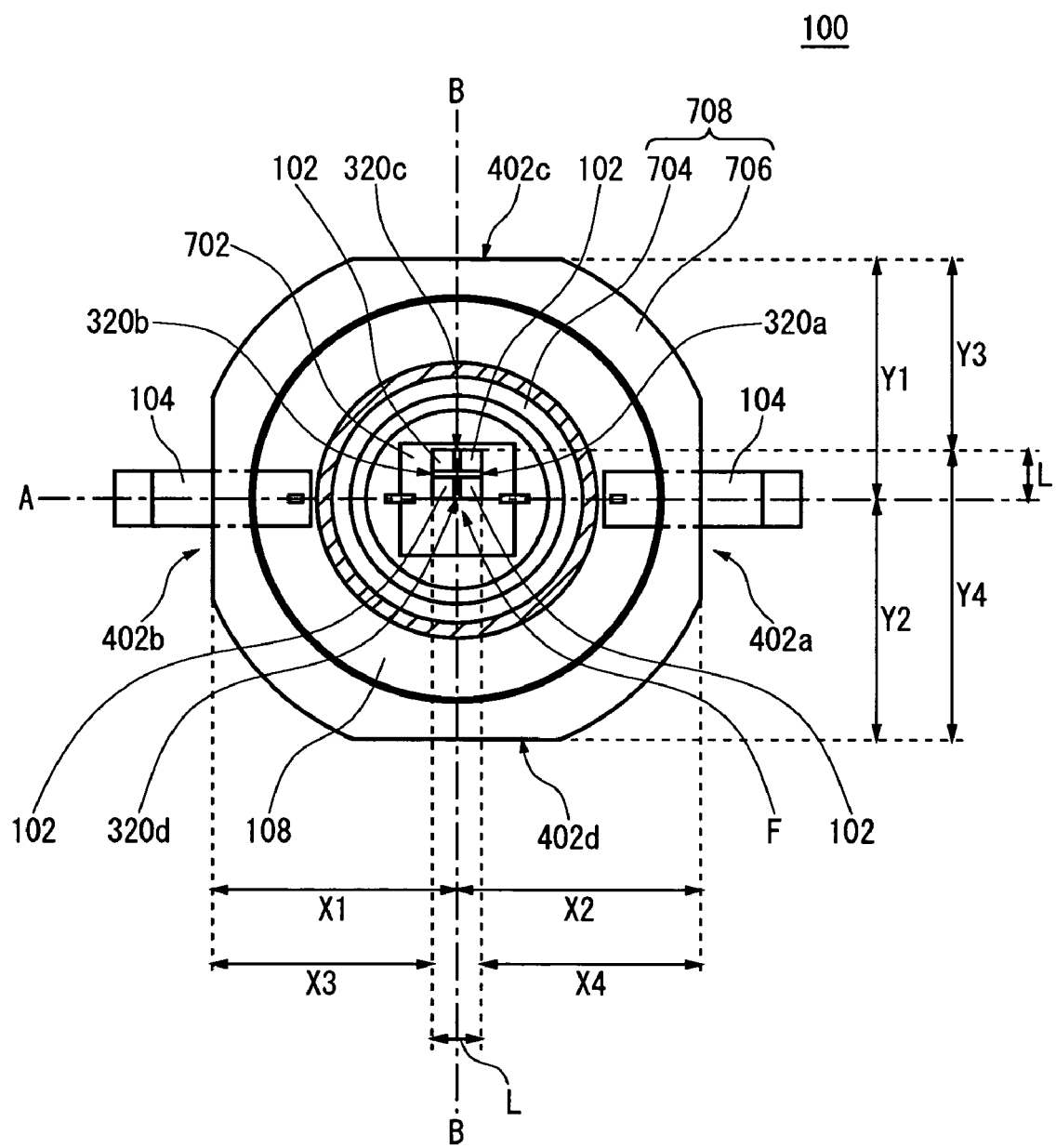
FIG. 14 shows another example of structure of the LED module.

FIG. 14 shows another example of structure of the LED module 100. Further, matters in FIG. 14 given the same symbols as those in FIGS. 5, 6 and/or 7 except the points to be described later will not be described because they have the same or similar functions as those in FIGS. 5, 6, and/or 7.

In this example, the LED module 100 includes a plurality of semiconductor light emitting elements 102. A plurality of semiconductor light-emitting elements 102 are positioned in order in an approximate square region surrounded by the imaginary line segment 320a to 320d. Each of the line segments 320a to 302d is, for example, a part of an envelope which includes each side of a plurality of the semiconductor light-emitting elements 102 which are adjoining each other.

The holding member 708 adjusts the distance between one line segment 320d and at least a part of a plurality of the sides 402a–402d so as to fix the semiconductor light emitting elements 102. The holding member 708 fixes the semiconductor light emitting elements 102 in such a manner that, for example, the distance between the line segment 320d and the side 402d is equal to the distance Y2 in place of the side 310d which is used when explained FIGS. 3, 4, and 5. In another example, the holding member 708 may adjust the distance between any of the line segment 320b~d and any of the side 402a–402d so as to fix the semiconductor light emitting elements 102. In this case, it is possible to fix the semiconductor light emitting elements 102 with high accuracy.

The lens 204 (see FIG. 3) has the Focus F at the center of the line segment 320. In this case, the lens 204 can project the shape of the side of the semiconductor light-emitting element 102 on the line segment 320d in the forward direction of the automobile. The lens 204 may project the shape of the lighting region, where a part of boundary includes the side of the 102 as a part. According to this example, the light distribution pattern can be formed properly.

Figure 15:
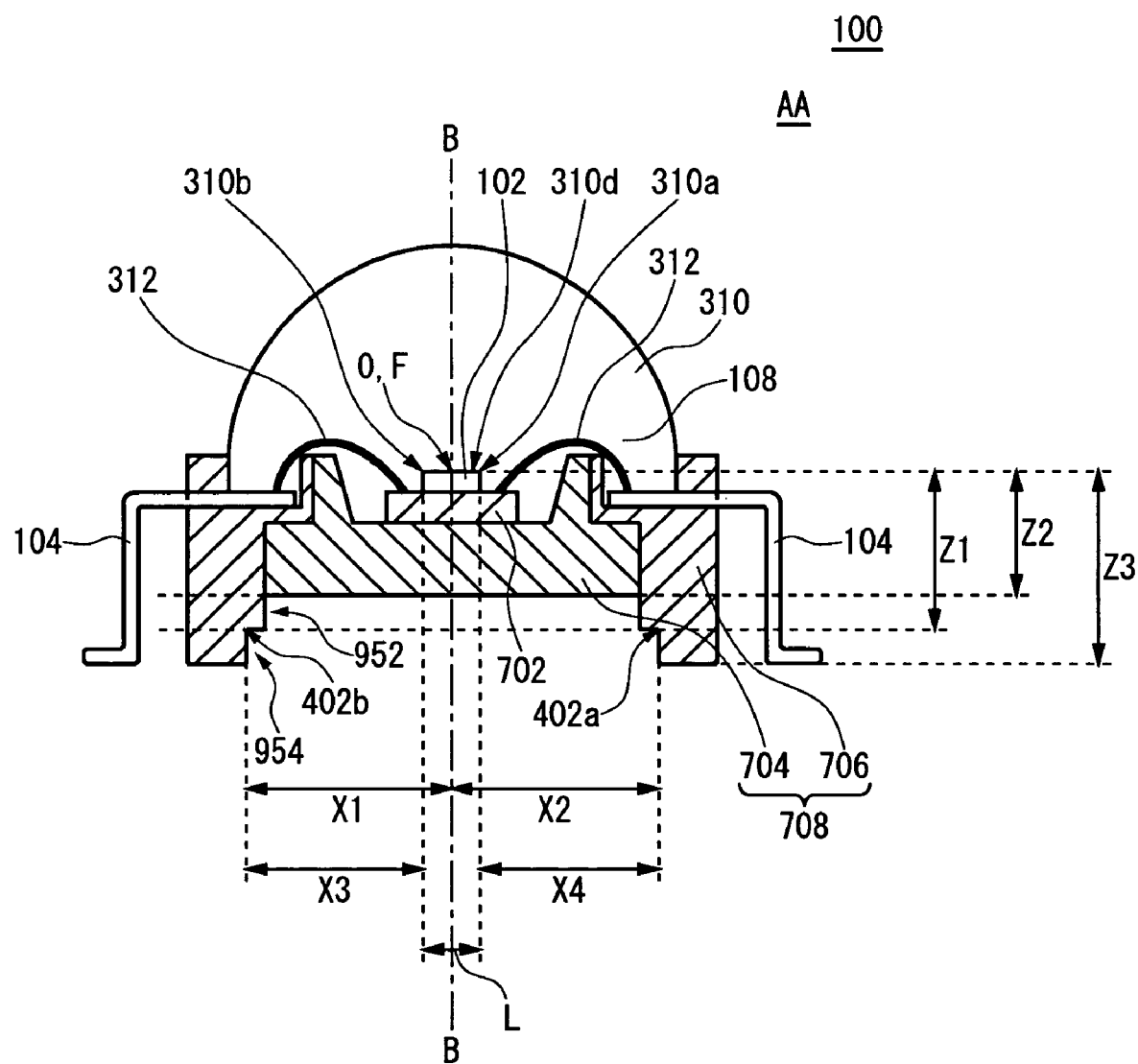
FIG. 15 shows an A—A cross-section of the LED module.
Figure 16:
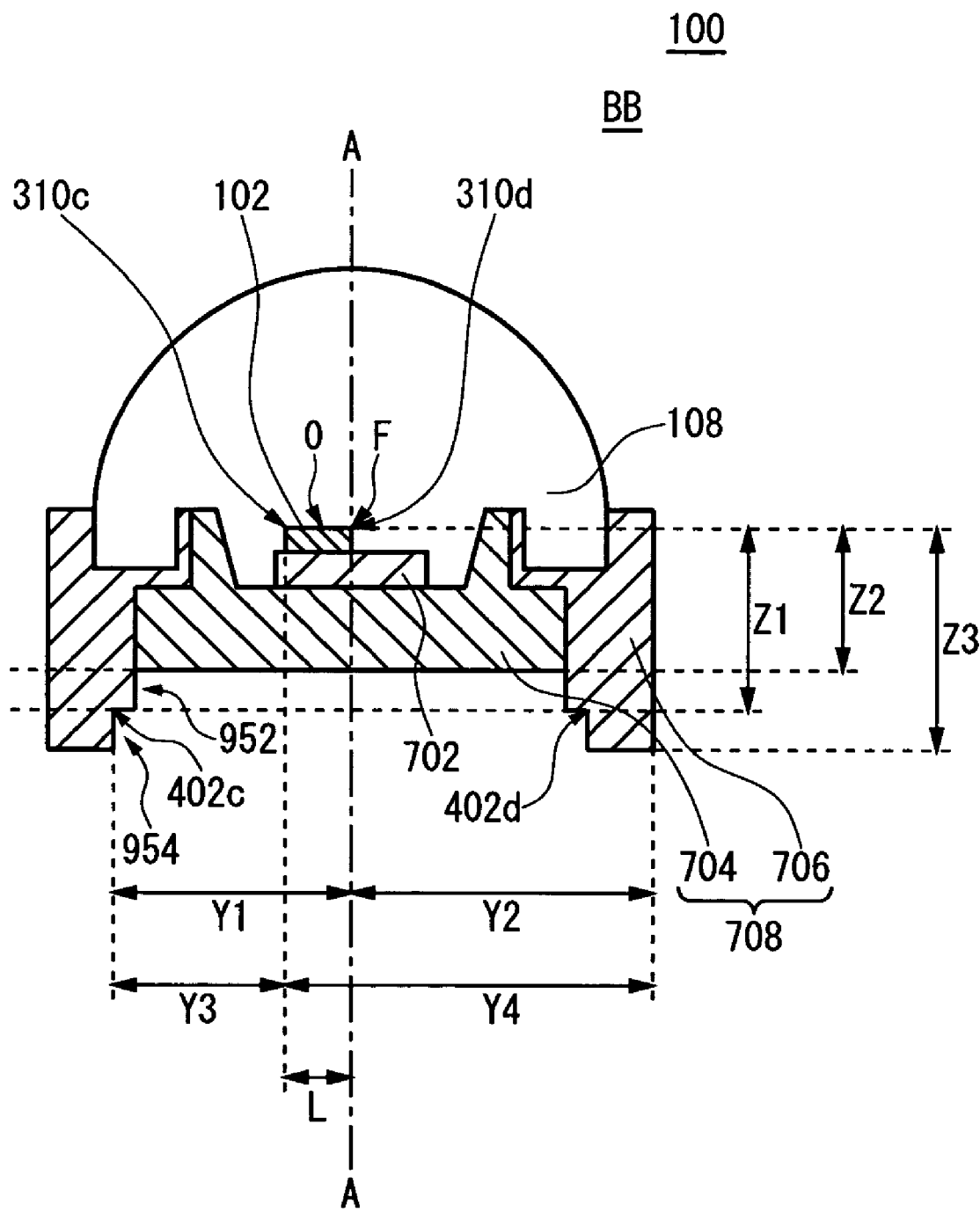
FIG. 16 shows a B—B cross-section of the LED module.
Figure 17:
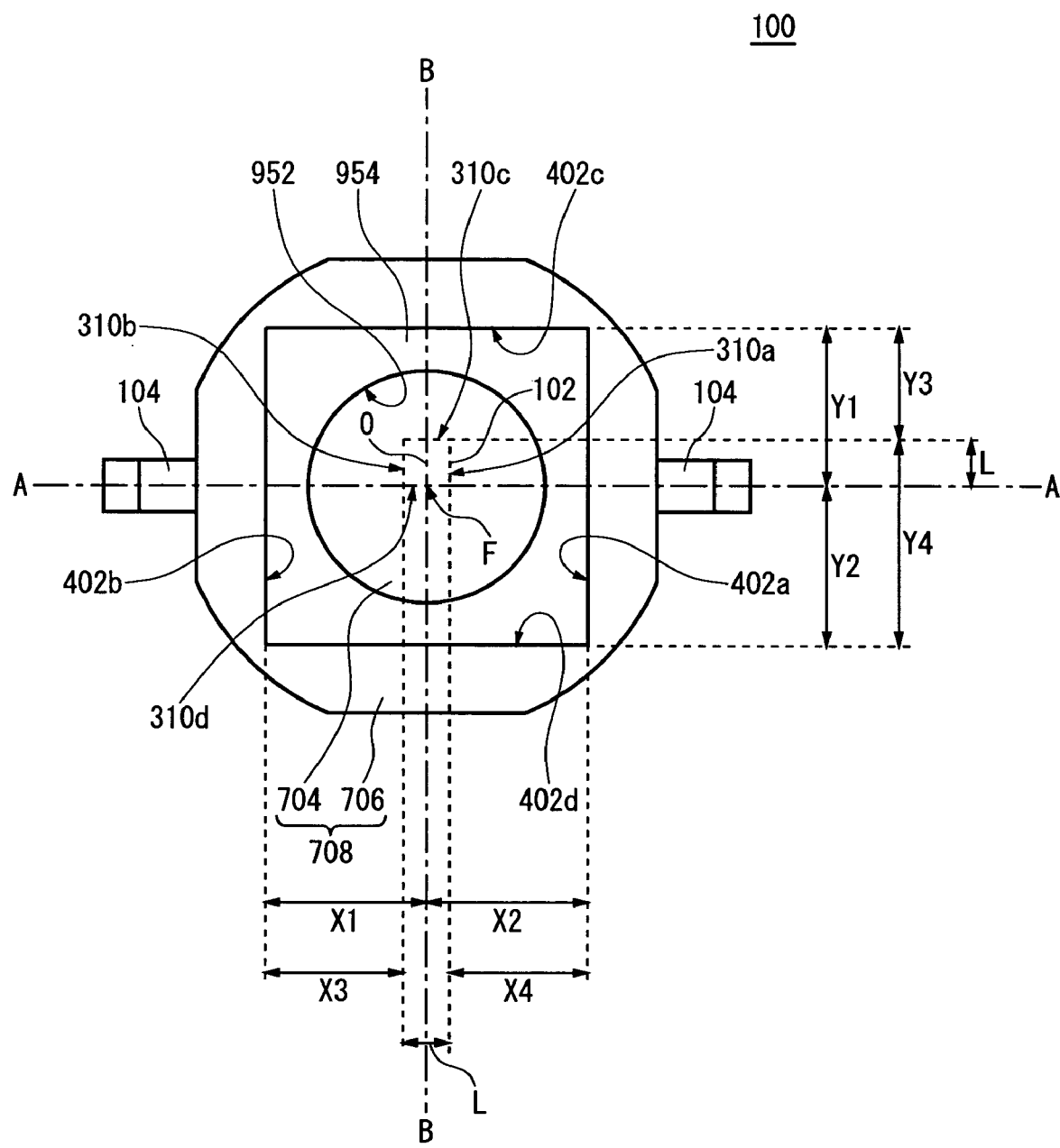
FIG. 17 shows a bottom view of the LED module 100.

FIGS. 15, 16 and 17 show another example of structure of the LED module 100. FIG. 15 shows an A—A cross-section of the LED module 100. FIG. 16 shows a B—B cross-section of the LED module 100. FIG. 17 shows a bottom view of the LED module 100. Further, matters in FIGS. 15, 16 and 17 given the same symbols as those in FIGS. 5, 6, and/or 7 except the points to be described later will not be described because they have the same or similar functions as those in FIGS. 5, 6 and/or 7.

In this example, the body 706 has a slug accommodating member 952 and expanding member 954. The slug accommodating member 952 is formed to cover the circumference of the slag 704. Thus, the slug accommodating member 952 accommodates and fixes the slug 704.

The expanding member 954 is formed expanding from the lower end of the slug accommodating member 952 in the lower direction. Here, for example, the lower direction is defined as the direction which directs from an apex of the hemispherical sealing member 108 to the center of the hemispheroid. The expanding member 954 has an approximate square like hole, in its under surface, hollowed in the direction which is vertical to the surface of the semiconductor light emitting element 102. This hole has a plurality of sides 402a–402d in at least of a part of the surface of the inner wall. Each of sides 402a–402d is an example of the reference member indication the semiconductor light emitting element 102. The sides 402a–402d may be formed at the face of the inner wall of the holding member 708.

The sides 402a–402d may be formed on the plane parallel to the surface of the semiconductor light emitting element 102. The slug accommodating member 952 and the expanding member 954 may be formed in such a manner that the plane corresponds to the boundary between them.

In this example, the holding member 708, for example, fits the side 310d to the position with the relative position to the sides 402a to 402d, so as to fix the semiconductor light-emitting element 102. The holding member 708 fixes the semiconductor light emitting element 102, for example, in such a manner that the distance between the side 310d and the side 402d is equal to the distance Y2 and the distance between one end of the side 310d and side 402b is equal to the distance X3. In addition the holding member 708 fixes the semiconductor light-emitting element 102 in such a manner that the distance between the surface of the semiconductor light emitting element 102 and the plate including the sides 402a–402d is equal to the distance Z1. In this case, also, the semiconductor light-emitting element 102 can be fixed with high accuracy. Accordingly, the vehicular lamp 10 (see FIG. 1) can form the light distribution pattern properly.

Further, the holding member 708 may fix the semiconductor light emitting element 102 in such a manner that the distance between the surface of the semiconductor light emitting element 102 and the bottom end of the expanding member 954 is equal to the predetermined distance Z3. In another example, the holding member 708 may adjust the distance between any of the line segment 310a–d and any of the side 402a–402d so as to fix the semiconductor light emitting elements 102, as explained in FIGS. 3, 4 and 5.

Figure 18:
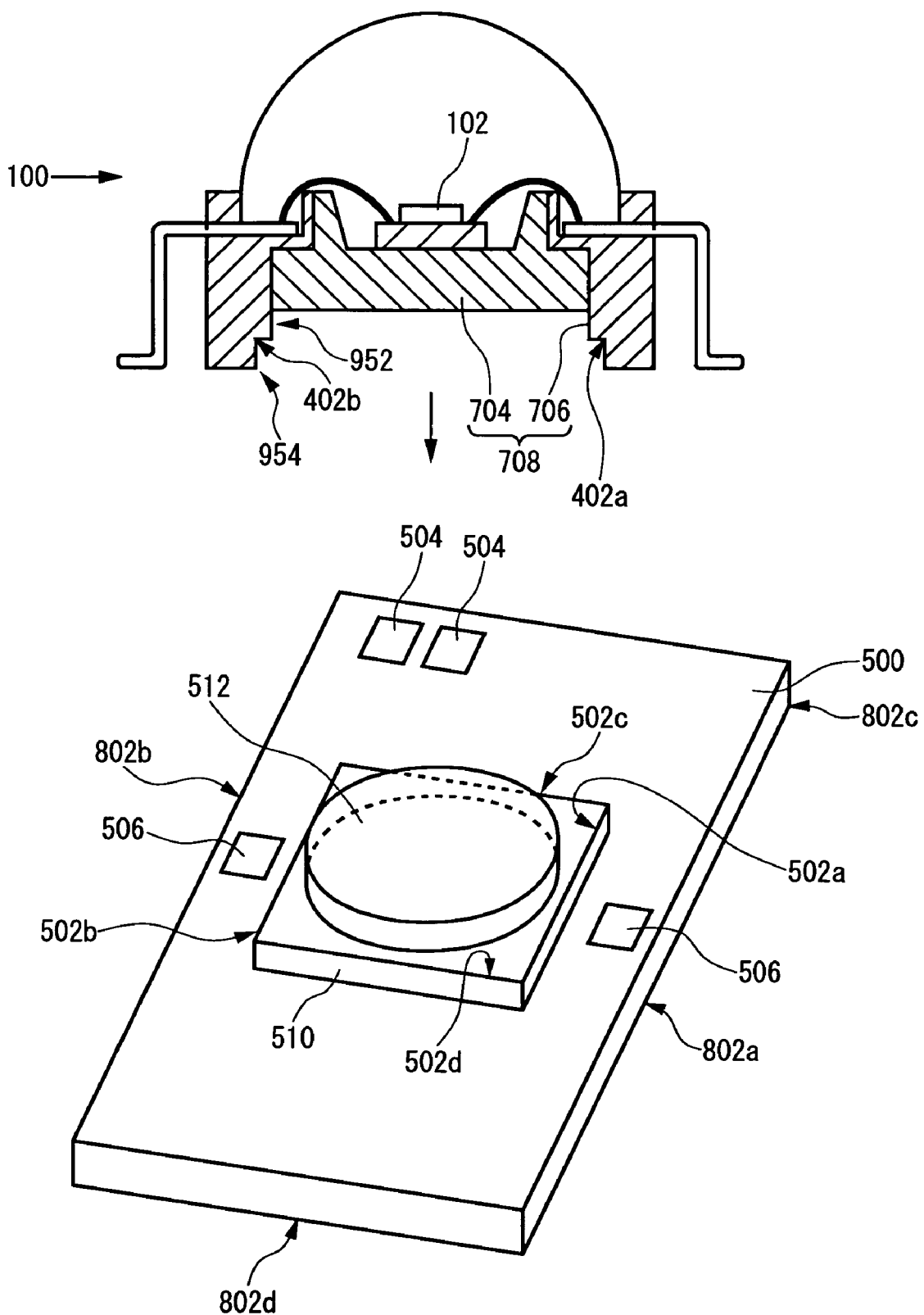
FIG. 18 shows another exemplary structure of the substrate.

FIG. 18 shows another exemplary structure of the substrate 500 with the LED module 100 explained in FIGS. 15, 16, and 17. Further, matters in FIG. 18 given the same symbols as those in FIG. 8 except the points to be described later will not be described because they have the same or similar functions as those in FIG. 8.

In this example, the substrate 500 has a plurality of stands 510 and 512. The stands 510 and 512 are accommodated in holes of the holding member 708 so as to fix the LED module 100 to the reference position. The stand 512 has the sides 502a–502d corresponding to the sides 402a–402d on the top surface that is to be faced to the LED module 100. Each of the sides 502a–502d is an example of the reference side indicating the reference position where the LED module 100 is to be provided. The reference position is, for example, defined as the position a relative position of which with respect to the lens 204 (see FIG. 3) is predetermined, when the fixing member 202 fixes the substrate 500 as shown in FIG. 3.

The stand 510 allows the side face including the side 502a–502d to come into contact with the faces of the inside walls of the holding member 708 including the side 402a–402d, thereby fixing the LED module 100 to the reference position. Thus, the LED module 100 can be fixed with high accuracy.

The stand 512 is formed to be projected from the top surface. And the top surface of the stand 512 contacts with the bottom surface of the slug 704 when the substrate 500 fixes the LED module 100. Thus, the stand 512 receives the heat produced by the semiconductor-light emitting element 102 via the slug 704. According to this example, the LED module 100 can be fixed properly. Thus, the vehicular lamp 10 (see FIG. 1) can form the light distribution pattern properly.

Figure 19:
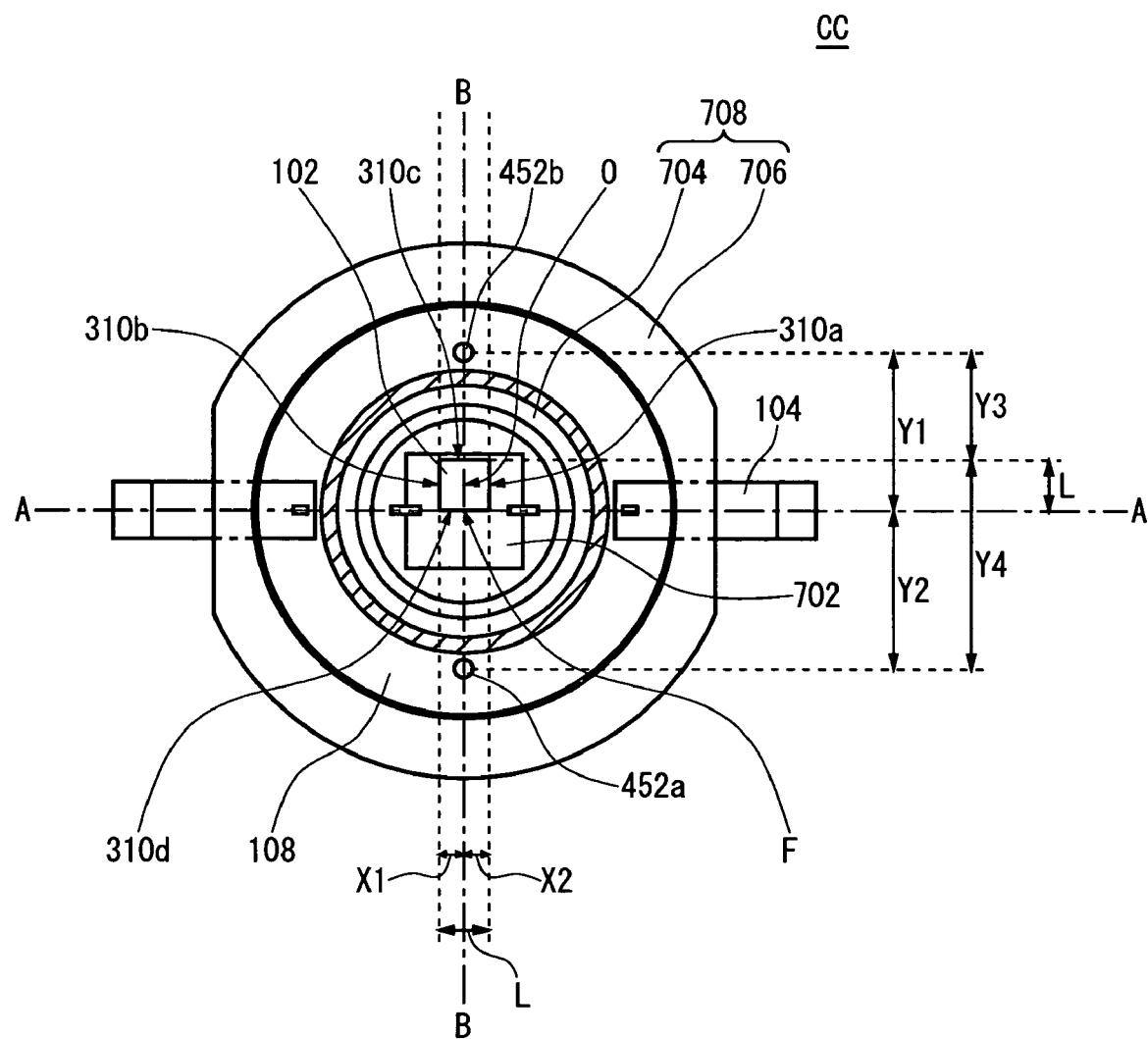
FIG. 19 shows a C—C cross-section of the LED module.
Figure 20:
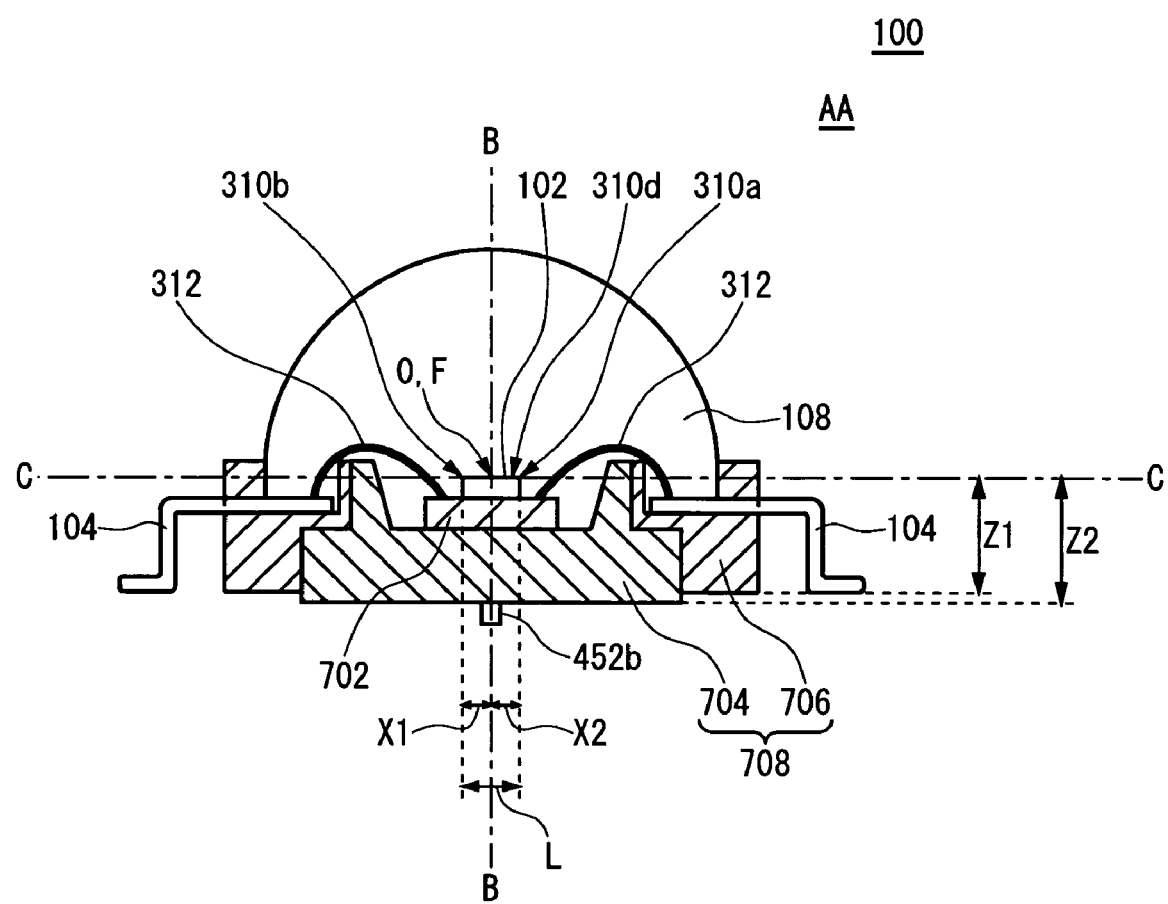
FIG. 20 shows an A—A cross-section of the LED module.
Figure 21:
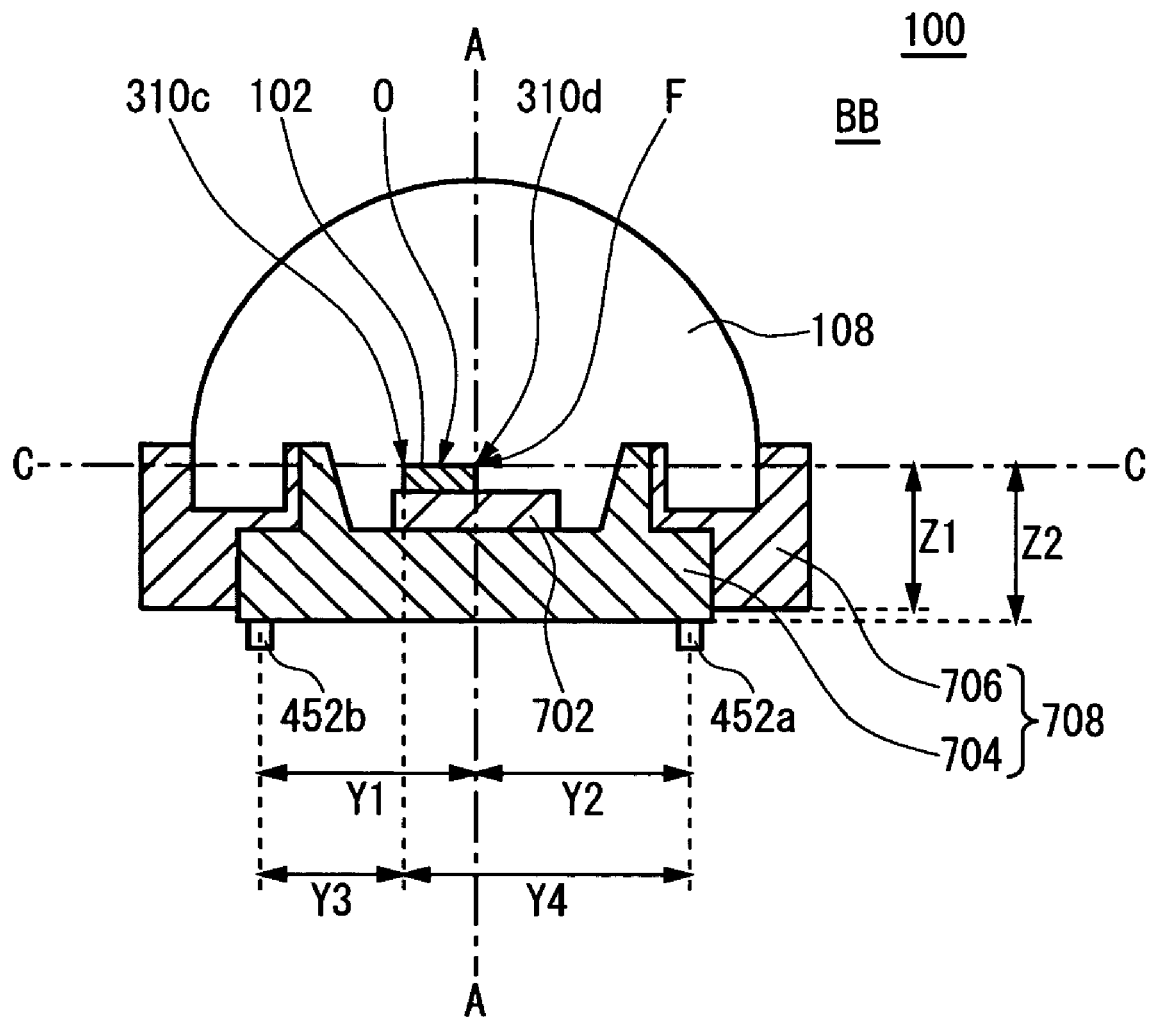
FIG. 21 shows a B—B cross-section of the LED module.

FIGS. 19, 20 and 21 show another example of structure of the LED module 100. FIG. 19 shows a C—C cross-section of the LED module 100. FIG. 20 shows an A—A cross-section of the LED module 100. FIG. 21 shows a B—B cross-section of the LED module 100. Further, matters in FIGS. 19, 20 and 21 given the same symbols as those in FIGS. 5, 6 and/or 7 except the points to be described later will not be described because they have the same or similar functions as those in FIGS. 5, 6 and/or 7.

In this example, the LED module 100 has a plurality of projections 452a and 452b. The projection 452a and 452b are projected from the bottom surface of the holding member 708 in the lower direction of the holding member 708. The projection 452a and 452b may be projected from the bottom surface of the slug 704.

The holding member 708 fits the side 312d to the positions the relative position of which with respect to the projections 452a and 452b is predetermined so as to fix the semiconductor light emitting elements 102. The holding member 708, for example, fixes the semiconductor light emitting elements 102 in such a manner that the distance between the side 312d and the projection 452a is equal to the distance Y2. In this case, the holding member 708 fixes the semiconductor light emitting elements 102 in such a manner that the distance between one end of the side 310d and the projection 452a is equal to the distance X1 and the distance between the other end of the side 310d and the projection 452a is equal to the distance X2. In this case, the semiconductor light emitting elements 102 can be also fixed with high accuracy. Accordingly, the vehicular lamp 10 (see FIG. 1) can form the light distribution pattern properly.

Further, each of the projection 452a and 452b is an example of the reference member indicating the position of the semiconductor light emitting elements 102. The distance between the side 310d and the projection 452a is, for example, defined as the distance between each projected images when the side 310d and the central axes of the projection 452a are projected on the plane parallel to the surface of the semiconductor light-emitting element 102. The distance between the side 310d and one end of the projection 452a is, for example, defined as the distance between each projected images when the one end and the central axes of the projection 452a are projected on the plane parallel to the surface of the semiconductor light-emitting element 102. The distance between the side 310d and the other end of the projection 452a is, for example, defined as the distance between each projected images when the other end and the central axes of the projection 452a are projected on the plane parallel to the surface of the semiconductor light-emitting element 102.

In another example, the holding member 708 may fit the side 312d on a line which connect the projection 452a and 452b so as to fix the semiconductor light-emitting element 102. Or the holding member 708 may adjust the distance between any of the sides 310a–d and any of the projections 452a and 452b so as to fix the semiconductor light-emitting element 102.

Figure 22:
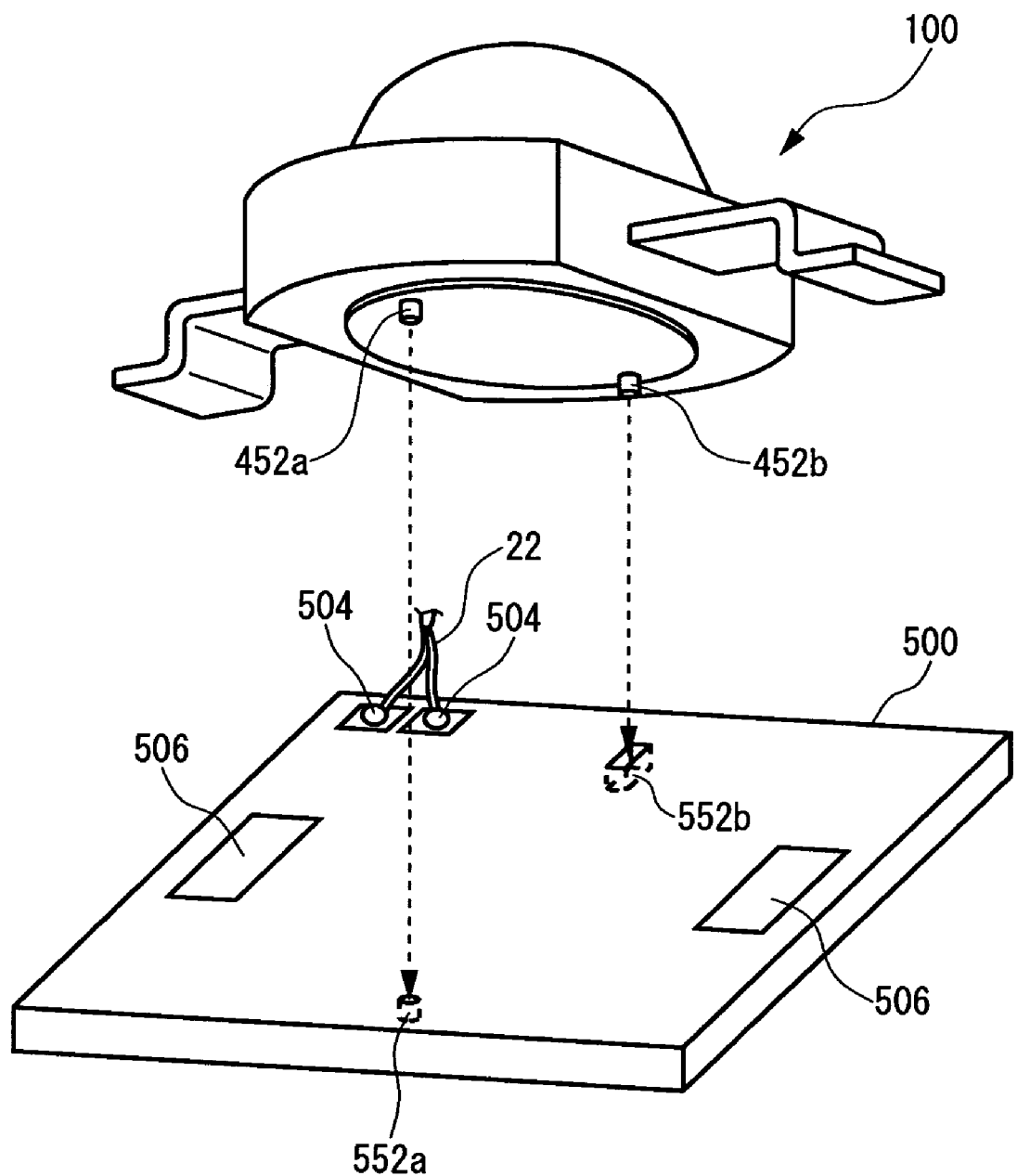
FIG. 22 shows another exemplary structure of the substrate.

FIG. 22 shows another exemplary structure of the substrate 500 with the LED module 100 explained in FIGS.19, 20, and 21. Further, matters in FIG. 22 given the same symbols as those in FIG. 8 except the points to be described later will not be described because they have the same or similar functions as those in FIG. 8.

In this example, the substrate 500 has a plurality of connecting members 552a and 552b that are provided corresponding to the projections 452a and 452b. Each of the connecting members 552a and 552b is connected with each of the projections 452a and 452b when the substrate 500 fixes the LED module 100. The connecting members 552a and 552b are provided at the reference point where the LED module 100 is to be fixed. The reference position is, for example, defined as the fixing position the relative position of which with respect to the lens 204 is predetermined (see FIG. 3) when the holding member 708 (see FIG. 3) fixes the substrate 500. Thus, the substrate 500 can fix the LED module 100 to the lens 204 with high accuracy.

In this example, the one connecting member 552b has a mechanical play in the direction, connecting the one connecting member 552b and the other connecting member 552a and then is connected with the projection 452b corresponding. And the other connecting member 552a is connected to the projection 452a corresponding with approximate no allowance in the same direction. Then, both the connecting members 552a and 552b are connected with the projections 452a and 452b with approximate no allowances in the direction, which is vertical to the said direction and parallel to the surface of the substrate 500. In this case the top of the projection 452b is connected to the connecting member 552b and then the projection 452a is connected to the connecting member 552a, thereby the LED module 100 can be provided to the substrate 500 easily. According to this example, the LED module 100 can be fixed properly. Thus, the vehicular lamp 10 (see FIG. 1) can form the light distribution pattern properly.

Further in another example, the LED module 100 may have a hole (see FIG. 19) formed at the holding member 708 in place of the projection 452a and 452b. In this case, the substrate 500 may have a projection to be connected with this hole as the connecting member 552a and 552b. In this case, the LED module 100 can be fixed properly. Further, the LED module may have a hole formed at the holding member 708 in place of any one of the projection 452a or 452b. The substrate 500 may have a hole and a projection to be connected with these members as a plurality of the connecting member 552a and 552b.

Figure 23:
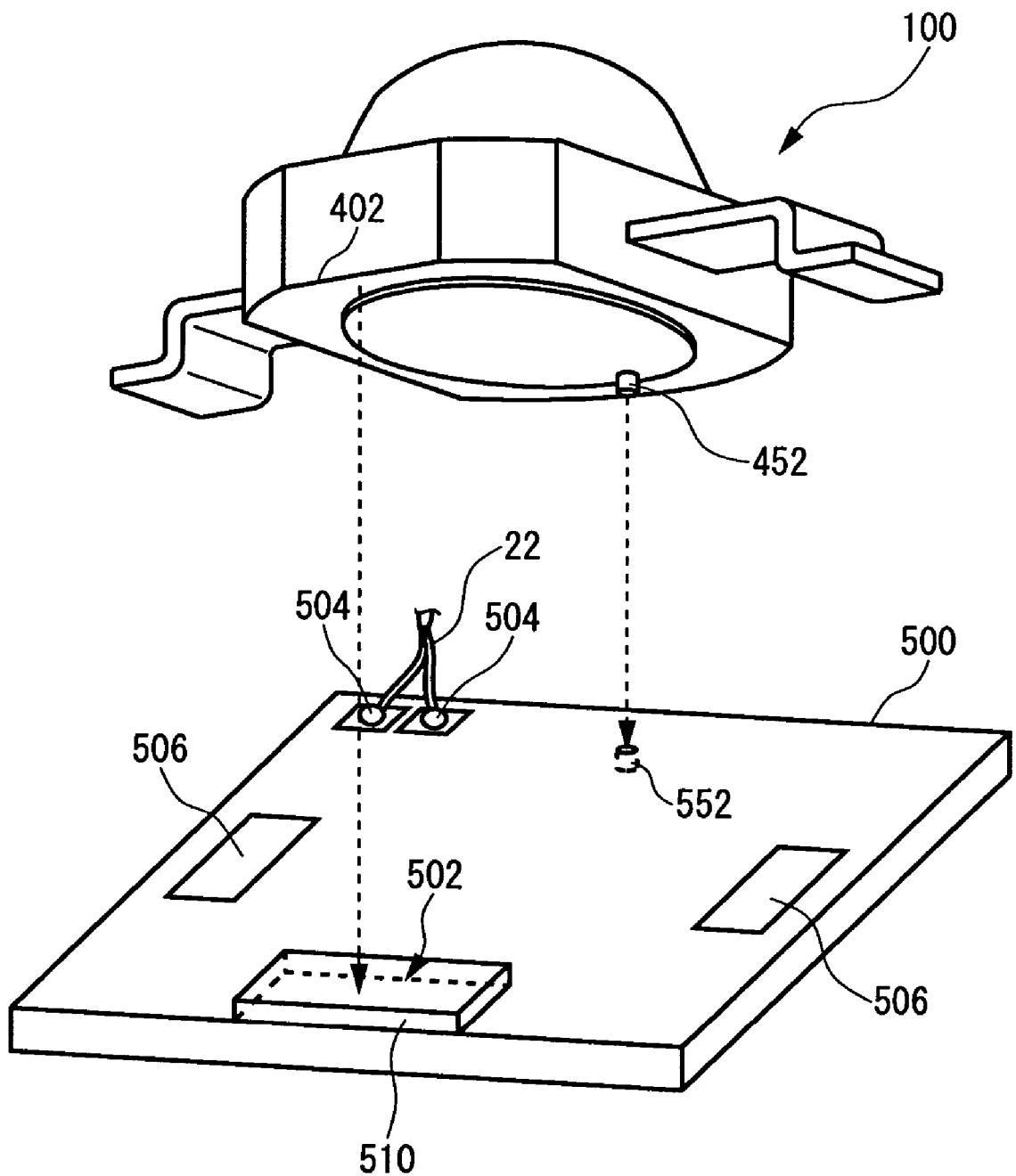
FIG. 23 shows another exemplary structure of the LED module and the substrate.

FIG. 23 shows another exemplary structure of the LED module 100 and the substrate 500. Further, matters in FIG. 23 given the same symbols as those in FIGS. 5 to 8, 18 and/or FIGS. 19 to 22 except the points to be described later will not be described because they have the same or similar functions as those in FIGS. 5 to 8, 18 and/or FIGS. 19 to 22.

In this example, the LED module 100 has the side 402 and the projection 452. Each of the side 402 and the projection 452 is an example of the standard member indicating the position of the semiconductor light-emitting element 102 (see FIG. 5).

And the substrate 500 has a stand 510 and a connecting member 552. The stand 510 and the connecting member 552 indicate the reference position where the LED module 100 is to be provided. The stand 510 includes a side 502.

The stand 510 allows the side face including the side 502 to come into contact with the faces of the inner walls of the LED module 100 including the side 402 when the substrate 500 fixes the LED module 100. The connecting member 552 is connected to the projection 452. In this case, the LED module 100 can be fixed with high accuracy. Thus, according to this example, the vehicular lamp 10 (see FIG. 1) can form the light distribution pattern properly.

Figure 24:
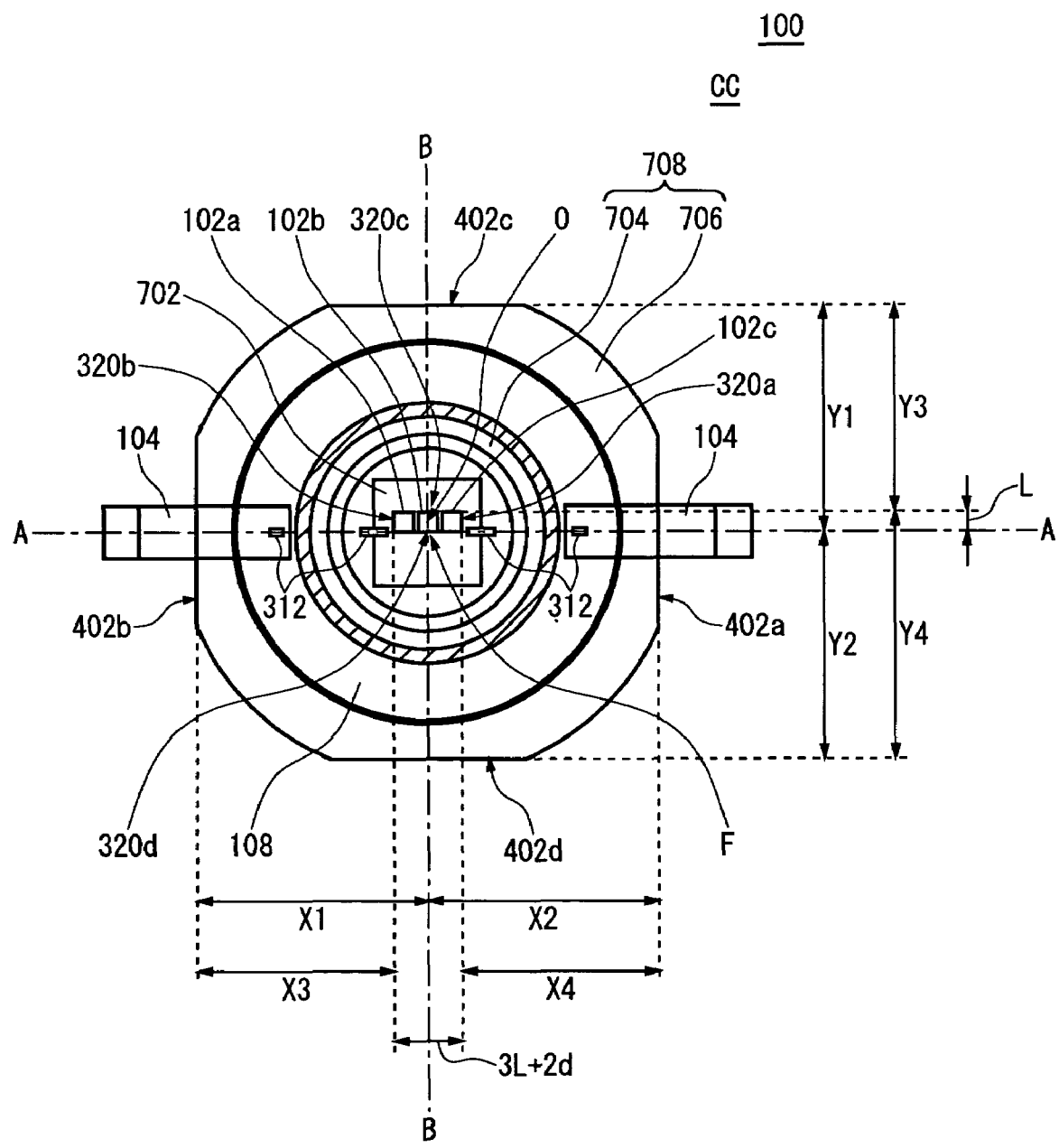
FIG. 24 shows another exemplary structure of the LED module.

FIG. 24 shows another exemplary structure of the LED module 100. Further, matters in FIG. 24 given the same symbols as those in FIGS. 5 to 7 and/or FIG. 14 except the points to be described later will not be described because they have the same or similar functions as those in FIGS. 5 to 7 and/or FIG. 14.

In this example, the LED module 100 has a plurality of the semiconductor light-emitting elements 102. A plurality of semiconductor light emitting elements 102a–c are positioned in order, for example, with their clearance d that is about less than 0.01 mm, in a approximate square region surrounded by the imaginary line segment 320a~d to allow one of the sides to be fitted to the imaginary line segment 320d.

The holding member 708 adjusts the distance between the segment 320d and at least a part of a plurality of the sides 402a–402d so as to fix the semiconductor light emitting elements 102a–c. The holding member 708 fixes the semiconductor light emitting elements 102a–c in such a manner that the distance between the line segment 320d and the side 420d is equal to the distance Y2, for example. In another example, the holding member 708 may adjust the distance between any segment 320b~d and any sides 402a–402d so as to fix the semiconductor light emitting elements 102a–c. In this case, semiconductor light emitting elements 102a–c can be fixed with high accuracy.

Further, the lens 204 (see FIG. 3) has a Focus f at the center of the line segment 320d. In this case, the lens 204 can project the shape of the sides of the semiconductor light emitting elements 102a–c on the line segment 320d clearly in forward direction of the automobile. In this case, it is possible to form the cut line properly by projecting the shape of the sides of semiconductor light emitting elements 102a–c. Thus, according to this example, the light distribution pattern can be formed properly.

The vehicular lamp to which the present invention may be applied includes headlamps such as a regular headlamp, fog lamp or cornering lamp for automobiles, motorcycles or trains.

Although the present invention has been described by way of exemplary embodiments, it should be understood that those skilled in the art might make many changes and substitutions without departing from the spirit and the scope of the present invention which is defined only by the appended claims.

What is claimed is:

1. A vehicular lamp for use in a vehicle, comprising:
a light source module generating light;
an optical member operable to emit the light produced by said light source module out of said vehicular lamp; and
a light source fixing member which fixes said light source module to a reference position which has a predetermined relative position with respect to said optical member, wherein said light source module includes:
a reference member which is fixed to be fitted to said reference position when said light source module is fixed to said optical member,
a semiconductor light emitting element which emits light from a lighting region having at least a linear boundary; and
a holding member which fits said linear boundary to a fixing position having a predetermined relative position with respect to said reference position, so as to hold said semiconductor-emitting light.

2. A vehicular lamp as claimed in claim 1, wherein said optical member projects a shape of said lighting region and forms at least a part of a cut line which defines a boundary between a bright region and a dark region based on a shape of said linear boundary.

3. A vehicular lamp as claimed in claim 1, wherein said reference member is one side of said holding member, and said light source fixing member has a reference side to indicate said reference position and allows a plane which includes said one side to come into contact with a plane which includes said reference side so as to fit said reference member to said reference position, thereby fixing said light source module.

4. A vehicular lamp as claimed in claim 3, wherein said semiconductor light emitting element emits light from said lighting region that has at least two straight boundaries which are not parallel each other, said holding member has two sides the relative positions of which with respect to said two straight boundaries are predetermined, and
said light source fixing member has two said reference sides and allows a plane which includes two said reference sides to come into contact with a plane which includes said two sides so as to fit said reference member to said reference position.

5. A vehicular lamp as claimed in claim 1, wherein said reference member is a hole or a projection formed in said holding member, and
said light source fixing member includes a connecting member which is to be connected to said reference member corresponding to said hole or said projection at the position of said reference position.

6. A vehicular lamp as claimed in claim 5, wherein said light source module has at least two said reference positions,
said light source fixing member has at least two said connecting members which are connected to at least each of said two reference members,
one of said two connecting members connects said reference members corresponding, including an allowance which expands in the direction connecting one connecting member to the other connecting member.

7. A vehicular lamp as claimed in claim 5, wherein said light source module has a first said reference member corresponding to said hole or said projection and second reference member corresponding to a side of said holding member, and
said light source fixing member has a reference side to indicate said reference position and allows a plane which includes said one side to come into contact with a plane which includes said reference side so as to fit said reference member to said reference position.

8. A vehicular lamp as claimed in claim 1, wherein the fixing position is a focus of the optical member.

9. A vehicular lamp as claimed in claim 1, wherein the linear boundary is fixed to the fixing position so that the position error is less than or equal to 5 percent with respect to the length of an edge of the semiconductor light emitting element.

10. A vehicular lamp as claimed in claim 1, wherein the linear boundary is fixed to the fixing position so that the position error is less than or equal to 1 percent with respect to the length of an edge of the semiconductor light emitting element.

11. A light source module for generating light, comprising:
a reference member which is fitted to a reference position that is predetermined so as to fix said light source module when said light source module is fixed to said reference position,
a semiconductor light emitting element for emitting light from a lighting region having at least a linear boundary; and a holding member for fitting said linear boundary to a fixing position the relative position of which with respect to said reference position is predetermined, so as to hold said semiconductor-emitting light;
wherein the linear boundary is fixed to the fixing position so that the position error is less than or equal to 5 percent with respect to the length of an edge of the semiconductor light emitting element.

12. A light source module as claimed in claim 11, wherein fixing position is a focus of the optical member.

13. A light source module as claimed in claim 11, wherein the linear boundary is fixed to the fixing position so that the position error is less than or equal to 1 percent with respect to the length of an edge of the semiconductor light emitting element.

* * * * *